(12) United States Patent
Baird et al.

(10) Patent No.: US 9,306,093 B2
(45) Date of Patent: Apr. 5, 2016

(54) CHALCOPYRITE-TYPE SEMICONDUCTOR PHOTOVOLTAIC DEVICE

(75) Inventors: Brian W. Baird, Portland, OR (US); Timothy D. Gerke, Portland, OR (US)

(73) Assignee: Fianium Ltd., Southampton (GB)

( * ) Notice: Subject to any disclaimer, the term of this patent is extended or adjusted under 35 U.S.C. 154(b) by 0 days.

(21) Appl. No.: 13/821,009

(22) PCT Filed: Sep. 6, 2011

(86) PCT No.: PCT/EP2011/065416
§ 371 (c)(1),
(2), (4) Date: Jun. 7, 2013

(87) PCT Pub. No.: WO2012/032064
PCT Pub. Date: Mar. 15, 2012

(65) Prior Publication Data
US 2013/0327389 A1     Dec. 12, 2013

Related U.S. Application Data

(60) Provisional application No. 61/380,306, filed on Sep. 6, 2010, provisional application No. 61/460,386, filed on Dec. 31, 2010, provisional application No. 61/477,946, filed on Apr. 21, 2011, provisional application No. 61/480,320, filed on Apr. 28, 2011.

(30) Foreign Application Priority Data

Sep. 6, 2010    (GB) .................................. 1014778.3

(51) Int. Cl.
*H01L 31/0352*    (2006.01)
*H01L 31/0236*    (2006.01)
(Continued)

(52) U.S. Cl.
CPC ........ *H01L 31/0236* (2013.01); *B23K 26/0624* (2015.10); *B23K 26/0732* (2013.01);
(Continued)

(58) Field of Classification Search
CPC . H01L 31/00; H01L 31/0322; H01L 31/0352; H01L 31/035272; H01L 31/03923; H01L 31/042; H01L 31/05; H01L 31/18; H01L 31/186; H01L 31/02; H01L 31/0248; H01L 31/035281; H01L 31/03529; H01L 31/04; H01L 31/043; H01L 31/0504; H01L 31/0508; H01L 31/072
USPC ................................................... 136/243–265
See application file for complete search history.

(56) References Cited

U.S. PATENT DOCUMENTS

2005/0253142 A1* 11/2005 Negami et al. .................. 257/65
2007/0227578 A1   10/2007 Perozziello et al.
(Continued)

FOREIGN PATENT DOCUMENTS

| EP | 1716964 A1 | 11/2006 |
| JP | 2007194605 A | 8/2007 |
| JP | 2011040462 A * | 2/2011 |

OTHER PUBLICATIONS

English machine translation of Hosono et al. (JP 2011-040462), published Feb. 24, 2011.*

(Continued)

*Primary Examiner* — Christina Chern
(74) *Attorney, Agent, or Firm* — Peter Rainville

(57) ABSTRACT

A scribed photovoltaic device, comprising a photovoltaic device configured for generating electrical energy responsive to receiving solar radiation, the photovoltaic device comprising a plurality of electrically connected photovoltaic sections comprising a photovoltaic light absorbing chalcopyrite semiconductor region ("PLACS region") disposed between first and second electrode regions. The photovoltaic sections can each comprise a scribe channel extending along and into two of the regions, wherein the scribe channel can comprise a pair of spaced opposing sidewalls of one of the regions, a pair of terraces comprising a pair of spaced opposing terrace shoulders, and a second pair of spaced opposing sidewalls of another one of the regions, with the spacing of the second pair of sidewalls being different than the spacing of the first pair of sidewalls. The spacing of the second pair of sidewalls can be less than the spacing of the first pair of sidewalls, and another one of the regions comprises the PLACS region.

16 Claims, 20 Drawing Sheets

(51) Int. Cl.
*B23K 26/073* (2006.01)
*H01L 21/268* (2006.01)
*H01L 31/073* (2012.01)
*H01L 31/0749* (2012.01)
*H01L 21/78* (2006.01)
*H01L 31/18* (2006.01)
*H01L 31/046* (2014.01)
*H01L 31/0463* (2014.01)
*B23K 26/40* (2014.01)

(52) U.S. Cl.
CPC ............. *B23K26/364* (2015.10); *B23K 26/409* (2013.01); *H01L 21/268* (2013.01); *H01L 21/78* (2013.01); *H01L 31/046* (2014.12); *H01L 31/0463* (2013.01); *H01L 31/073* (2013.01); *H01L 31/0749* (2013.01); *H01L 31/18* (2013.01); *Y02E 10/543* (2013.01)

(56) References Cited

U.S. PATENT DOCUMENTS

2007/0240759 A1* 10/2007 Borden .................... 136/258
2008/0029152 A1    2/2008 Milshtein et al.
2011/0011458 A1*  1/2011 Denda et al. ............. 136/261

OTHER PUBLICATIONS

Amendment by applicant for made on Oct 30, 2013, annotated copy (16 pages) for EP 26 14525.
Amendment by applicant for EP2614525 made on Oct 30, 2013, inserted page in specification (1 page).
Letter to European Patent Office accompanying Amendment by applicant for EP2614525 made on Oct 30, 2013 (5 pages).
Communication pursuant to Rules 161(1) and 162 EPC for EP2614525 issued Apr. 19, 2013 (2 pages).
International Search report issued for PCT/EP2011/065416 (5 pages) mailed on Apr. 27, 2012.
International Preliminary Report on Patentability for PCT/EP2011/065416 (11 pages) issued Mar. 12, 2013.
Huber Heinz P et al. "High speed structuring of CIS thin-film solar cells with picosecond laser ablation", Proc. of SPIE, vol. 7203, pp. 1-9, XP008148338. (2009).
Ruthe D et al. "Etching of CuInSe2 thin films-comparison of femtosecond and picosecond laser ablation", Applied Syrface Science, vol. 247, No. 1-4, pp. 447-452 (2005).
Kurt Weingarten "High average power, high pulse energy, picoseconds lasers for material processing", Environment Professional Microtechnologies EPMT Conference, pp. 1-28. (2008).
Brian Baird, "P2 and P3 Spatially shaped laser scribing of CdTe thin film photovoltaic solar cells using a 532 nm picosecond master oscillator fiber power amplifier", 26th European Photovoltaic Solar Energy Conference and Exhibition. (2011).
Schillinger, et al. "High speed laser scribe system for large area thin film solar cell manufacturing", European Photovoltaic Solar Energy Conference and Exhibition, Sep. 21-25, 2009.
Bonse, et al. "Recent Advances in Laser Scribing Process Technologies for Thin Film Solar Cell Manufacturing", 23rd European Photovoltaic Solar Energy Conference and Exhibition, Sep. 1-5, 2008.
Lee, "Method for converting a Gaussian laser beam into a uniform beam", Optics Communications, vol. 36, No. 6, Mar. 15, 1981, pp. 469-471.
Compaan, "Laser scribing of polycrystalline thin films", Optics and Lasers in Engineering 34 (2000) 15-45.
Thin-film PV Scribing Using a High-Energy Picosecond Pulsed Fiber Laser, Application Lab Notes posted on www.fianium.com, available online in 2010.
Hermann et al., selective Ablation of thin films with short and ultrashort laser pulses, Applied Surface Science, vol. 252, 2006, pp. 4814-4815.
Huber et al., Selective structuring of thin-film solar cells by ultrafast laser ablation Proc. of SPIE vol. 6881, 688117, (2008).

* cited by examiner

CHALCOPYRITE-TYPE SEMICONDUCTOR PHOTOVOLTAIC DEVICE

FIELD OF THE INVENTION

The present invention relates to a photovoltaic device based on a chalcopyrite-type semiconductor, such as a copper indium diselenide, copper indium gallium diselenide or copper indium gallium disulphide.

BACKGROUND

Thin-film photovoltaic devices based on copper indium diselenide ("CIS") and copper indium gallium diselenide ("CIGS") are known in the art. Such devices can be highly efficient, for example, having conversion efficiencies greater than 18%.

A typical thin-film photovoltaic device is formed on a substrate (sometimes referred to as a "superstrate") on which layers are deposited and patterned using a set of scribes to form a series-connected chain of cells. An example of such a process is described in US 2007/0227578 A which is incorporated herein by reference.

To fabricate a thin-film photovoltaic device, a bottom electrode, usually comprising molybdenum (Mo), is deposited on the substrate and is divided into stripes using a first set of scribes (commonly referred to as "P1" scribes). An active layer comprising, for example copper indium gallium diselenide, is deposited over the scribed electrode and is patterned using a second set of scribes ("P2" scribes) to form individual cells. A top, transparent electrode is formed over the scribed active layer and is patterned using a third set of scribes ("P3" scribes) to define a set of series connections in which the top of one cell is connected to the bottom of an adjacent cell. In some thin-film photovoltaic devices, a fourth set of scribes, known as "isolation" or "edge deletion" scribes, may be used to provide additional electrical isolation.

An example of a system for P1, P2 and P3 scribing is the Innolas Impala system produced by Innolas System GmbH, Robert-Stirling-Ring 2, 82152 Krailling, Germany. In the Impala system, P1 scribing is carried out using a Nd:YAG or Nd:YVO$_4$ laser operating at, for example, 1064 nm. However, P2 and P3 scribing is performed mechanically, which can result in non-uniform scribes.

Investigations have been conducted into using laser-based systems for patterning copper indium diselenide and copper indium gallium diselenide.

"Etching of CuInSe$_2$ thin films—comparison of femtosecond and picosecond laser ablation", D. Ruthe et al., Applied Surface Science, volume 247, pages 447 to 452 (2005) describes laser micromachining multilayer samples consisting of a 1.8 μm thick CuInSe$_2$ layer deposited on a 0.55 μm thick back contact (0.5 μm molybdenum) covering a 25 μm thick polyimide substrate. The samples are micromachined using a commercial Ti:sapphire laser, which provides 130 fs pulses at a wavelength of 775 nm, and using a Nd:YVO$_4$ picosecond laser system with a pulse length of 10 ps at a wavelength of 1064 nm having respective spot diameters (Gaussian beam diameter at 1/e$^2$) of 22 μm and 25 μm respectively.

"Selective ablation of thin films with short and ultrashort laser pulses", J. Hermann et al., Applied Surface Science, volume 252, pages 4814 to 4818 (2006) describes micromachining experiments using three different laser sources. Nanosecond laser pulses of visible (532 nm) and UV (193 nm) radiation are delivered by second harmonic using Nd:YAG and ArF excimer lasers respectively operating at a 10 Hz repetition rate. Ultrashort laser pulses of 100 fs duration, 1 mJ energy and 1 kHz repetition rate are delivered using a Ti:sapphire laser system.

"High average power, high pulse energy, picoseconds lasers for material processing", K. Weingarten, EPMT conference 5 Jun. 2008, Lausanne, Switzerland describes using a picosecond laser for micromachining and lists possible applications.

"High speed structuring of CIS thin-film solar cells with picosecond laser ablation", H. P. Huber et al., Proceeding of SPIE, volume 7203, pages 72030R-1-9 (2009) describes using a High Q Laser model "picoREGEN IC-1064-1500" emitting at a wavelength of 1064 nm with a pulse duration of about 10.2 ps (FWHM) at variable repetition rates up to 30 kHz. The laser is used for P1, P2 and P3 patterning.

While laser-based systems have the potential to provide more uniform scribing, they can suffer a number of drawbacks. In particular, using existing laser-based systems, P3 and isolation/edge deletion scribing can lead to melting and intermixing of layers and result in formation of melt residues which can impair performance of the thin-film photovoltaic device.

SUMMARY

In one aspect, the present invention provides an improved method of processing a layer structure for a photovoltaic device which includes a layer of chalcopyrite-type semiconductor material, such as copper indium gallium diselenide or copper indium gallium disulphide. The invention is also directed to improved photovoltaic devices.

In one aspect, there is provided a method including providing a layer structure for a photovoltaic device, the layer structure comprising a light absorber disposed between a transparent electrode disposed on one side of the light absorber and another electrode disposed on the other side of the light absorber, the light absorber comprising chalcopyrite-type semiconductor material; and delivering a spatially-shaped picosecond ("ps") pulsed laser beam so as to remove material with the spatially shaped laser beam from a region of the transparent electrode so as to expose at least a portion of the light absorber, the spatially shaped laser beam having a non-Gaussian spatial profile.

Using a spatially-shaped ps laser beam can help to provide better control over which layers are selected when removing regions of layers from the layer structure. This can be used for P3 scribing and at least part of an isolation scribe, such as, for example, an edge deletion scribe.

The spatially-shaped ps laser beam can be configured to remove material from the region of the transparent electrode without substantially removing material from the light absorber. The spatially-shaped ps laser beam can be configured to remove material from a region of the light absorber so as to expose the another electrode.

The light absorber can have a first ablation threshold and the another electrode can have a second, higher ablation threshold and the spatially shaped laser beam can have a fluence equal to or higher than the first ablation threshold and lower than the second ablation threshold. The light absorber can comprise CIGS and the another electrode can comprise molybdenum. The second ablation threshold can be within a selected percentage of the fluence used to remove material from a region of the light absorber so as to expose the another electrode. The selected percentage can be, in various practices of the invention, 10%; 5%; or 2.5% or 1.5%.

In one aspect, the spatially shaped beam can be referred to as the first beam and the method can comprise delivering a second spatially-shaped ps pulsed laser beam that is configured differently than the first beam, the second spatially shaped ps beam being delivered so as to remove material with the second spatially-shaped ps pulsed beam from a region of the light absorber so as to expose the another electrode, the second spatially shaped beam having a non-Gaussian spatial profile.

The first and second beams can have different wavelengths. For example, the second beam can have a longer wavelength (e.g., about 532 nm) than the first beam (e.g., about 355 nm). The first and second beams can have different pulsewidths. The first and second laser beams can have different dimensions or side lengths. The second beam can have a smaller dimension or side length than the first laser beam.

The second laser beam can have a different fluence from the first laser beam. For example, the second laser beam can have a greater fluence than the first laser beam. The second laser beam can have a different pulse repetition rate from the first laser beam. The light absorber can have a first ablation threshold and the another electrode can have a second, higher ablation threshold and the second laser beam can have a fluence equal to or higher than the first ablation threshold and lower than the second ablation threshold.

The second ablation threshold can be within a selected percentage of the fluence of the second laser beam. The selected percentage can be, in various practices of the invention, 10%; 5%; or 2.5% or 1.5%.

The optical separation between a final image lens and the layer structure can be changed after delivering the first laser beam.

In another aspect, the method comprises delivering a third ps pulsed laser beam so as to remove material with the third beam from a region of the another electrode so as to expose a substrate. The third laser beam and the first laser beam and/or the second laser beam can have different wavelengths. The third laser beam and the first laser beam and/or second laser beam can have different pulsewidths. The third laser beam and the first laser beam and/or second laser beam can have different dimensions or side lengths. The third laser beam can have a smaller dimension or side length than the first laser beam and/or the second laser beam.

The third laser beam can be translated relative to layer structure so as to cause the third laser beam to travel at least once along an elongate pattern defined in the light absorber at a speed in a range of 10 mm/s to 10,000 mm/s. Material from the region of the another electrode can be removed in response to the third laser beam travelling at least twice along the elongate pattern.

The third laser beam can have a different fluence from the first laser beam and/or the second laser beam. The third laser beam can have a greater fluence than the first laser beam and/or the second laser beam. The third laser beam can have a different pulse repetition rate from the first laser beam and/or the second laser beam. For example, the third laser beam can have a greater pulse repetition rate from the first laser beam and/or the second laser beam.

A method according to the disclosure can include changing separation between a final image lens and the layer structure after delivering the first laser beam and, if delivered, the second laser beam. The light absorber can have a first ablation threshold, the another electrode can have a second, higher ablation threshold and the substrate can have a third ablation threshold which is higher than the second ablation threshold, and the third laser beam can have a fluence equal to or higher than the second ablation threshold.

The third laser beam can have a spatial profile that is substantially Gaussian. The third laser beam can be spatially shaped. The third laser beam can comprise a substantially rectangular (e.g., substantially square) spatial shape.

One of the spatially shaped ps pulsed laser beams, the first or second spatially shaped ps pulsed laser beam, or the third ps pulsed laser beam, or any combination of the foregoing (referred to hereinafter as "one, two or three of the laser beams") may have a substantially uniform intensity profile. Delivering the laser beam may include receiving a Gaussian picosecond pulsed laser beam having a Gaussian spatial profile and passing the spatially Gaussian picosecond pulsed laser beam to a beam shaper apparatus, which may comprise a diffractive optical element, and/or a plate having an aperture.

One, any two of or three of the beams can have a wavelength in a range of about 200 nm to 1600 nm; or about 500 nm to about 550 nm; about 250 nm to about 400 nm; about 200 nm to about 600 nm; about 900 nm to about 1200 nm; about 250 nm to 600 nm; about 400 nm to about 1200 nm; or about 300 nm to about 1200 nm. The laser beam can have a wavelength of about 355 nm; about 520 nm; about 1060 nm; or about 1550 nm.

One, any two or three of the beams can have a pulsewidth in a range of 1 ps to 500 ps; or in a range of 100 fs to 200 ps; or in a range of 200 fs to 40 ps.

One, any two or three of the beams can have a substantially rectangular beam shape, such as, for example, a substantially square beam shape. One, two or all of the beams can have a diameter or length of side in a range of 10 to 200 µm or in a range of 20 to 100 µm. The third beam can have a substantially Gaussian spatial shape. As one example, one of both of the spatially shaped ps pulsed beam and the second beam can have a substantially rectangular spatial shape and the third beam can have a substantially Gaussian spatial shape.

One, any two or three of the beams can be translated relative to the layer structure so as to cause the laser beam to travel at least once along a path across the surface of the layer structure at a speed in a range of 10 mm/s to 10,000 mm/s. The paths can all be different, any two can be the same, or they can all be the same. The transparent electrode can be removed responsive to the spatially-shaped ps laser beam travelling at least twice along substantially the same path. Material from the region of the light absorber can be removed in response to the second laser beam travelling at least twice along substantially the same path. Material from the region of the another electrode can be removed in response to the third laser beam travelling at least twice along substantially the same path.

One, any two or three of the laser beams can have a fluence in a range of 0.01 J/cm$^2$ to 20 J/cm$^2$ or, as another example, in the range of 0.05 J/cm$^2$ to 10 J/cm$^2$. One, any two, or all of the laser beams can have a pulse repetition rate in a range of 25 kHz to 2 MHz or, as another example, in the range of 100 kHz to 500 kHz.

The another electrode can comprise molybdenum. The layer structure can be provided on a substrate. The substrate can comprise one or more of a glass, a polymer (e.g., polyimide), a metal (e.g., a metal alloy).

The chalcopyrite semiconductor material can comprise one or more of a layer of copper indium diselenide ($CuInSe_2$); a layer of copper indium gallium diselenide ($CuInGaSe_2$); or a layer of copper indium gallium disulphide ($CuInGaS_2$).

The absorber layer can comprise a buffer interposed between the layer of the chalcopyrite semiconductor material and the transparent electrode, where the buffer including a layer of cadmium sulphide (CdS).

The transparent electrode can comprise a layer of doped zinc oxide (ZnO). The ZnO can be doped with aluminium.

In another aspect, there is provided a method of laser scribing a photovoltaic device that includes a chalcopyrite semiconductor based photovoltaic light absorber region, comprising providing a photovoltaic device having a photovoltaic light absorbing region comprising chalcopyrite semiconductor ("PLACS region"), the PLACS region being disposed between electrodes; removing a section of one of the electrodes with a first pulsed laser beam, comprising transmitting the first pulsed laser beam through the one of the electrodes at a wavelength where the one electrode is substantially transparent to the laser beam relative to the PLACS region such that the PLACS region is the more absorbent of the laser beam and wherein responsive to the laser beam an opening is formed in a surface of the one electrode and a section thereof extending downwardly from the opening toward the PLACS regions removed but wherein the chalcopyrite semiconductor material of the PLACS region is not substantially removed; and removing a section of the PLACS region with a second pulsed laser beam, comprising providing the second pulsed laser beam at a wavelength and a pulse duration wherein an ablation threshold contrast exists between the PLACS region and other electrode and such that the PLACS region ablation threshold is less than that of the other electrode, the providing including transmitting the second pulsed laser beam through the opening and such that it is between the ablation thresholds and removes the section of the PLACS region to expose a surface of the other electrode without substantially removing the other electrode.

The laser beam can have a fluence below the ablation threshold of the PLACS region. The laser beam can have a fluence near the ablations threshold of the PLACS region. The fluence of the laser beam can be not substantially greater than the ablation threshold of the PLACS region. The PLACS region can receive the laser beam near or below the ablation threshold of the PLACS region.

At least one of the first and second pulsed laser beams can comprise a wavelength in the range of from about 300 nm to about 680 nm. Both of the first and second pulsed laser beams comprise a wavelength in the range of from about 300 nm to about 680 nm. At least one of the first and second pulsed laser beams can comprise a spatial intensity distribution that is non-Gaussian. Both the first and second pulse laser beams can comprise a spatial intensity distribution that is non Gaussian. At least one of said first and second pulsed laser beams can comprise a substantially rectangular shape. Both of the first and second pulsed laser beams can comprise a substantially rectangular shape. The first pulsed laser beam can have a larger cross sectional area than the second pulsed laser beam so as to form a terrace between the electrode and the PLACS region. At least one of the first and second pulsed laser beams can comprises a spatial 1-dimensional (1-D) intensity distribution that is non-Gaussian. The fluence of the second pulsed laser beam, in some practices, does not substantially exceed the ablation threshold of the PLACS region. The fluence of the second pulsed laser beam, in some practices, is not greater than 1.2 times the fluence of the first pulsed laser beam. In some practices, the fluence of the second pulsed laser beam is not greater than 1.1 times the fluence of the first pulsed laser beam. In some practices, the fluence of the second pulsed laser beam is not greater than 1.05 times the fluence of the first pulsed laser beam. The fluence of the first pulsed beam can be less than 0.2 J/cm$^2$; 0.18 J/cm$^2$; 0.16 J/cm$^2$; 0.14 J/cm$^2$; 0.12 J/cm$^2$; 0.10 J/cm$^2$; or 0.08 J/cm$^2$. The temporal pulse width of the first pulsed laser beam can be from 1 ps to 500 ps. The temporal pulse width of the second pulsed laser beam can be from 1 ps to 500 ps. The pulse repetition rate of the first pulsed laser beam can be at least 50 KHz. The pulse repetition rate of the second pulsed laser beam can be at least 50 KHz.

In a preferred practice, the first and second pulsed laser beams have a wavelength within the visible wavelength range (more preferably from about 400 nm to 600 nm and most preferably in range from about 520 nm to 550 nm) and are spatially non Gaussian and/or have a 1-D intensity distribution having steep sides as compared to a hypothetical fitted Gaussian (see the discussion elsewhere herein).

In yet a further aspect, the disclosure teaches a method of laser scribing a photovoltaic device that includes a chalcopyrite semiconductor based photovoltaic light absorber region and electrode regions, comprising providing a photovoltaic device having a photovoltaic light absorbing region comprising chalcopyrite semiconductor ("PLACS region"), the PLACS region being disposed between first and second electrode regions; scribing with a first pulsed laser beam a first scribe that extends along and into one of the regions, the first laser beam removing material of the one region and exposing a surface of the other region; scribing with a second pulsed laser beam a second scribe that extends along and into the other region, the second pulsed laser beam being directed to at least part of the exposed surface for removing material of the other region, the second pulsed laser beam configured and positioned relative to the first scribe so as to leave a terrace comprising a section of exposed surface, the section extending between a sidewall of the one region and a sidewall of the other of the regions.

The one region can comprise the PLACS region and the other region can comprise an electrode region. The one region can comprise an electrode region and the other region can comprise the PLACS region. The first pulsed laser beam can comprise a first fluence and the second pulsed laser beam can comprise a second fluence that is greater than the first fluence. The first pulsed laser beam can be transmitted through one of the electrodes, which one electrode is substantially transparent at the wavelength of the first pulsed laser beam. Laser scribing the photovoltaic device can include forming a scribe channel in the photovoltaic device, the first scribe comprising a first channel of the scribe channel, the first pulsed laser beam comprising a first fluence and a first beam diameter for providing the first channel with a first channel width; the second scribe comprising a second channel of the scribe channel, scribing the second scribe with the second pulsed laser beam comprising transmitting the second pulsed laser beam though the first channel, the second pulsed laser beam having a second fluence that exceeds the first fluence and further having a second beam width that is less than the first beam width for providing the second channel with a width that is less than the first channel width, the second pulsed laser beam being positioned relative to the first channel so as to leave terraces and a pair of terrace shoulders form on opposing sides of the terrace channel; and wherein the first or second channel is scribed in the PLACS region.

The second channel can be scribed in the PLACS region. The first channel can be scribed in the PLACS region. At least one of the first and second pulsed laser beams can comprise a spatial intensity distribution that is substantially non-Gaussian. Both the first and second pulse laser beams can comprise spatial intensity distributions that are substantially non Gaussian.

At least one of said first and second pulsed laser beams can comprise a spatially non-Gaussian shape, such as, for example, a substantially rectangular shape. Both of the first and second pulsed laser beams can comprise a substantially rectangular shape. The first pulsed laser beam can have a larger cross sectional area than the second pulsed laser beam so as to form a terrace between the electrode and the PLACS region. At least one of the first and second pulsed laser beams can comprise a spatial intensity distribution that is substantially non-Gaussian.

In some practices of the invention, the fluence of the second pulsed laser beam does not substantially exceed the ablation threshold of the PLACS region. In some practices of the invention, the fluence of the second pulsed laser beam is not greater than 1.2 times the fluence of the first pulsed laser beam. In selected practices of the disclosure, the fluence of the second pulsed laser beam is not greater than 1.1 times the fluence of the first pulsed laser beam. In some practices the fluence of the second pulsed laser beam is not greater than 1.05 times the fluence of the first pulsed laser beam.

The fluence of the first pulsed beam can be less than 0.2 J/cm$^2$; 0.18 J/cm$^2$; 0.16 J/cm$^2$; 0.14 J/cm$^2$; 0.12 J/cm$^2$; 0.10 J/cm$^2$; or 0.08 J/cm$^2$. The temporal pulse width of the first pulsed laser beam can be from 1 ps to 500 ps.

The temporal pulse width of the first pulsed laser beam can be from 1 ps to 500 ps and wherein the temporal pulse width of the second pulsed laser beam is from 1 ps to 500 ps. The pulse repetition rate of the first pulsed laser beam can be at least 50 KHz. The pulse repetition rate of the second pulsed laser beam can be at least 50 KHz.

In another aspect, there is provided a method of laser scribing a photovoltaic device, comprising providing a photovoltaic device comprising at least one of a photovoltaic light absorbing (PLA) region and a conductive electrode (CE) region, providing a pulsed laser source providing pulses having a pulse width of between about 1 ps and 500 ps; deriving a pulsed laser processing beam from the pulsed laser source, the processing beam having a wavelength in a first selected wavelength range, the processing beam further comprising orthogonal non Gaussian 1-D spatial intensity distributions; scribing the photovoltaic device with the processing beam to form a length of a scribe channel in at least one of the PLA region and the CE region, the scribing comprising removing material with the process beam having the non-Gaussian spatial 1-D intensity profiles to form overlapping scribe segments, wherein the length of the scribe channel includes adjacent scribe segments having an overlap of not greater than a selected overlap percentage, overlap percentage being determined by $\Delta L/L \times 100$, wherein L is a scribe segment length along the scribe channel and $\Delta L$ is an overlap length of the scribe segment with the adjacent scribe segment; and the pulse repetition rate of the processing beam is not less than about a selected repetition rate.

The process beam can comprises a fluence of at least a selected fluence threshold. For example, the process can comprise a fluence of at least 0.1 J/cm$^2$; at least 0.12 J/cm$^2$ at least 0.15 J/cm$^2$; at least 0.18 J/cm$^2$; at least 0.2 J/cm$^2$; at least 0.25 J cm$^2$; at least 0.3 J/cm$^2$; or at least 0.4 J/cm$^2$.

The methods and apparatus described herein can provide a scribe channel having good upper edge definition. The scribe channel can comprise good sidewall definition with substantial avoidance of inter region mixing of disparate materials that would substantially detrimentally affect operation of the photovoltaic device such that it would be unsuitable for deployment.

The upper edge definition can be such that the peak to trough variation of the edge from a line is less than a selected percentage of the average width of the scribe channel. For example, the peak to trough variation can be no greater than 15%; no greater than 12%; no greater than 10%; no greater than 8%, no greater than 6%, no greater than 5; no greater than 4%; no greater than 3%, no greater than 2%; or no greater than 1% of the average width of the scribe channel.

The region or regions that are present can comprise at least one constituent that is chosen from a metal, a transparent conductive oxide, a chalcopyrite-type semiconductor; cadmium (e.g., a compound including cadmium, such as cadmium sulphide), a nitride of silicon (SiN$_x$) or an oxide of silicon (SiO$_x$). The regions of regions that are present can be selected from the group consisting of metal, a transparent conductive oxide, a chalcopyrite-type semiconductor; cadmium, a nitride of silicon or an oxide of silicon. Metal, by way of example and not limitation, includes mixtures and alloys thereof.

The methods and apparatus disclosed herein can comprise or use a pulsed laser source that can comprise a fiber gain medium, such as a laser oscillator and/or amplifier that includes a fiber gain medium. The fiber gain medium can comprise a length of optical fiber doped with one or more rare earths.

A laser beam or process beam according to the methods and apparatus disclosed herein can have a substantially uniform intensity region. For example, one of the orthogonal substantially spatially non Gaussian 1-D intensity profiles can have a section that includes the center of the intensity profile wherein the intensity does not vary by more than a selected percentage, which can be, for example, 10%, 5%, 3% or 2%, from the average intensity over the section. In various practices of the disclosure, the section can have a length of at least 15 µm, of at least 20 µm; of at least 25 µm, of at least 30 µm, or of at least 35 µm.

A laser or process beam according to the methods and apparatus disclosed herein can comprise a 1-D intensity profile can also be characterized in comparison to a hypothetical Gaussian fitted to the 1-D intensity profile fit to the non-Gaussian 1-D intensity distribution 325 using the parameters $I_o$ and r=w and the formula $I(r)=I_o e^{-2(r/w)2}$, where $I_o$ is the intensity at the center of the beam, and at a distance r=w from the center the beam has an intensity of $I_o/e^2$. The non-Gaussian 1-D intensity distribution can have an intensity $I_{NG}$ at a radius r=w/2 that is greater than the intensity $I_G$ of the hypothetical beam profile at r=w/2. $I_{NG}$ can be at least 1.35 times $I_G$; at least 1.4 times $I_G$; at least 1.45 times $I_G$ o; at least 1.5 times $I_G$; or at least 1.55 times $I_G$. Alternatively or additionally, the non-Gaussian 1-D intensity distribution can also be greater than the hypothetical fitted Gaussian distribution at the distance r=2w/3. For example at r=2w/3, the intensity of the non-Gaussian intensity distribution can be at least 1.9, at least 2.0, at least 2.1, at least 2.2, at least 2.3 or at least 2.4 times the intensity of hypothetical fitted Gaussian the same location from the center.

The peak to trough intensity variation of the non-Gaussian 1-D intensity distribution for the section bounded by r=w/2 as defined by the hypothetical Gaussian can be less that a selected percentage of the average intensity of the non-Gaussian beam within those points. For example, in certain practices of disclosure, the peak to trough variation can be less than 15%; less than 10%; or less than 7.5% of the average intensity within those points. In certain embodiments, the foregoing recitations relating to the percentage of the average represented by the peak to trough variation can apply to the non-Gaussian 1-D intensity distribution over the section bounded by the r=w/2 points.

The pulsed laser processing beam can comprise a single spatial mode. The pulse laser process beam can comprise an $M^2$ parameter of no greater than 2; no greater than 1.8, no greater than 1.6; no greater than 1.4; no greater than 1.3, no greater than 1.2, or no greater than 1.1.

A processing or laser beam can have a wavelength in a first selected wavelength range. For example, the first selected wavelength range can be from about 250 nm to about 400 nm; from about 400 nm to about 600 nm; from about 900 nm to about 1200 nm; from about 250 nm to about 600 nm; from about 400 nm to about 1200 nm, from about 300 nm to about 1200 nm; or from about 200 nm to about 1600 nm. The first selected wavelength range can comprise the "visible" wavelengths (about 390 nm to about 680 nm as the term "visible" is used herein). The processing beam can have a wavelength of about 532 nm or a wavelength of about 355 nm.

The scribe channel produced by the methods or apparatus disclosed herein can include adjacent scribe segments having an overlap of not greater than a selected overlap percentage. For example, in certain practices of the disclosure, the overlap is not greater than about 25%; not greater than about 20%; not greater than about 15%; not greater than about 10%; not greater than about 8%; not greater than about 6%; not greater than about 5%; not greater than about 4%; or not greater than about 3%.

The pulse repetition rate of a processing or laser beam can be not less than about a selected repetition rate. For example, the pulse repetition rate can be not less than about 50 kHz; not less than about 100 kHz; not less than about 150 kHz; not less than about 200 kHz; not less than about 225 kHz; not less than about 250 kHz; not less than about 300 kHz; or not less than about 500 kHz.

The present disclosure also comprises apparatus and systems.

For example, in one aspect there is provided a scribed photovoltaic device, comprising a photovoltaic device configured for generating electrical energy responsive to receiving solar radiation, the photovoltaic device comprising a plurality of electrically connected photovoltaic sections comprising a photovoltaic light absorbing chalcopyrite semiconductor region ("PLACS region") disposed between first and second electrode regions. The photovoltaic sections can each comprise a scribe channel extending along and into two of the regions wherein material of the two regions has been removed by a laser beam so as to form the scribe channel. The scribe channel can comprise a pair of spaced opposing sidewalls of one of the regions, a pair of terraces comprising a pair of spaced opposing terrace shoulders, and a second pair of spaced opposing sidewalls of another of the regions, the spacing of the second pair of sidewalls being different than the spacing of the first pair of sidewalls. One of the two regions comprises the PLACS region.

The pair of terraces can comprise a surface of the another of the regions. The spacing of the second pair of sidewalls can be less than the spacing of the first pair of sidewalls. The another of the regions comprises the PLACS region.

One of the regions can comprise one of the electrode regions, which can be optically transparent. The spacing of the second pair of sidewalls can be less than the spacing of the first pair of sidewalls. The one of the regions can comprise the PLACS region.

The scribe channel can be at least partially filled with an electrically insulating material.

BRIEF DESCRIPTION OF THE DRAWINGS

Certain embodiments of the present invention will now be described, by way of example, with reference to the accompanying drawings, in which:

FIG. 4b is a mapping taken from the beam of FIG. 4a;

FIG. 16b is a schematic representation of an embodiment of an optical architecture of an optical fibre amplifier for use with the fibre laser illustrated in FIG. 16a.

DETAILED DESCRIPTION OF CERTAIN EMBODIMENTS

Figure 1:
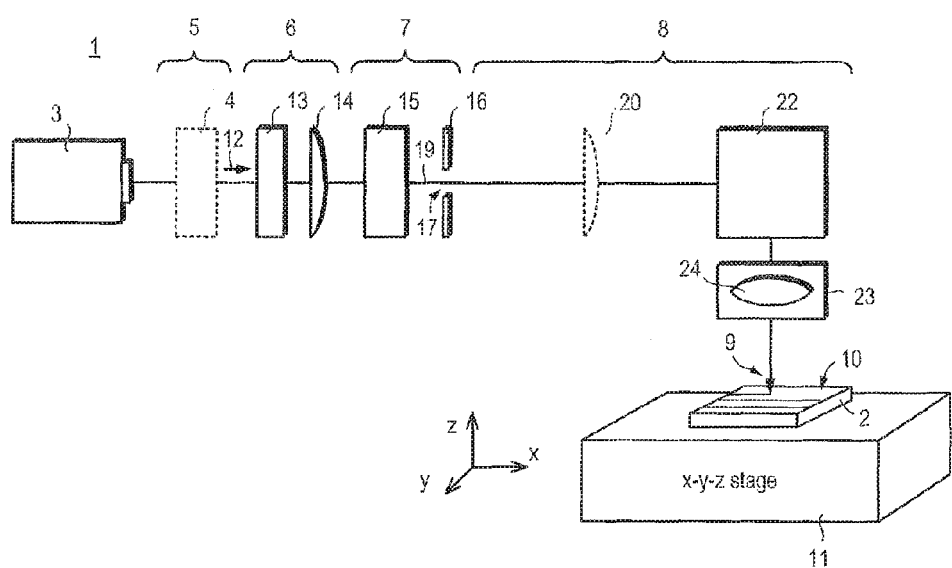
FIG. 1 schematically illustrates a system for patterning a layer structure using a picosecond pulsed laser beam.

Referring to FIG. 1, a system 1 for patterning a workpiece 2 is shown.

The system 1 comprises an ultrafast fibre laser 3 capable of generating picosecond pulsed laser pulses having a pulse-width in a range of 0.1 to 200 ps at a wavelength in a range of 0.2 to 1.6 μm. The laser 3 is configured to generate pulses having a pulse repetition frequency in a range of 10 kHz to 2 MHz.

The laser 3 can take the form of a diode-pumped ultrafast master oscillator fibre power amplifier (UF-MOFPA). An example of a suitable ultrafast fibre laser 3 is a Fianium™ High-Energy HE532 produced by Fianium UK Ltd., Southampton, United Kingdom.

In this example, the laser 3 includes an integrated optional harmonic conversion module (not shown) which converts a Gaussian $TM_{01}$ single spatial mode at a fundamental wavelength of 1064 nm into a beam at a second harmonic wavelength, namely 532 nm, and which has a substantially Gaussian spatial profile. However, the laser 3 may provide a beam at a fundamental wavelength. The system 1 may additionally or alternatively include an optional, external harmonic conversion module 4 in a frequency conversion section 5 to produce a beam at a harmonic wavelength.

The output of the laser 3 or external harmonic conversion module 5 is optically coupled into a first beam conditioning section 6 which in turn is optically coupled into a second beam conditioning section 7. The second beam conditioning section 7 can comprise a beam shaping apparatus, as is described in more detail below, and for convenience 7 is referred to hereinafter as a "beam shaping apparatus". The system 1 can include an imaging section 8 that produces an imaged beam 9 on a work surface 10 at the workpiece 2 which is supported on an x-y-z stage 11.

The imaged laser beam 9 pulsed laser processing beam can comprise a single spatial mode. The pulse laser process beam can comprise an $M^2$ parameter of no greater than 2; no greater than 1.8, no greater than 1.6; no greater than 1.4; no greater than 1.3, no greater than 1.2, or no greater than 1.1.

The beam conditioning section 6 can include first and second beam conditioning elements 13, 14 that cooperate to generate a beam having a substantially Gaussian spatial profile and a selected spectral content before passing the beam to the beam shaping apparatus 7. The beam conditioning elements 13, 14 preferably configured to produce a 2.5 mm beam waist diameter ($1/e^2$) at the input of the beam shaping apparatus, such as, for example, a the input of the beam shaping element 15 in the embodiment shown in FIG. 1.

The beam shaping apparatus 7 is configured to transform a Gaussian or near-Gaussian input beam into an non-Gaussian output beam, such as an output beam having a substantially rectangular (e.g., square) cross-sectional intensity profile and/or a substantially uniform intensity profile across the beam.

Figure 2:
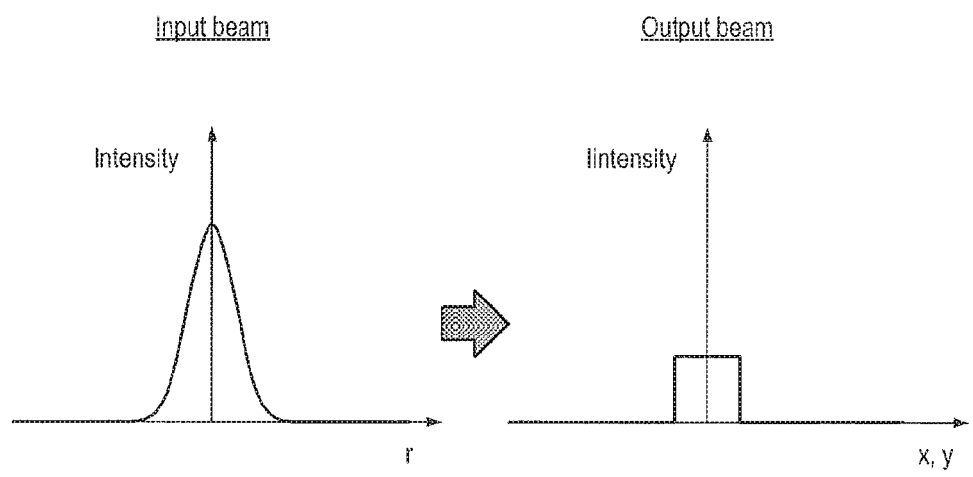
FIG. 2 schematically illustrates beam shaping.

FIG. 2 schematically illustrates transforming a beam having a Gaussian 1-D spatial intensity distribution to a beam having a non-Gaussian 1-D spatial intensity distribution, such the flat-top beam shown in FIG. 2 having a substantially uniform intensity profile.

Returning to FIG. 1, the beam shaping apparatus 7 can include one or more beam shaping elements, such as, for example, the first and second beam shaping elements 15, 16 shown in FIG. 1. Preferably the beam shaping apparatus (or one or more of the elements thereof) has a spectral bandwidth that is greater than or that corresponds substantially with full width half maximum bandwidth (FHWM) spectral bandwidth of the beam received by the beam shaping apparatus 7, as is discussed in more detail below.

The beam shaping apparatus 7 can comprise one or more diffractive or refractive optical elements. For example, the first beam shaping element 15 can comprise a diffractive optical element, such as a TH-034-Q-Y-A diffractive optical element produced by Holo/Or Ltd., Rehovot, Israel. The beam shaping apparatus can comprise a plurality of diffractive optical elements which cooperate to produce an output beam having a desired spatial shape. In another embodiment, the first beam shaping element 15 may comprise a refractive optical element, such as a pi-shaper 6_6_532/1064 beam shaper apparatus produced by Molecular Technology (MolTech) GmbH, Berlin, Germany.

Referring again to FIG. 1, the second beam shaping element 16 can comprise an alumina ceramic disc having a rectangular aperture 17 mounted in a copper heat sink (not shown). A suitable aperture element 16 is available from Lenox Laser, Glen Arm, Md., USA. The aperture element 16 may comprise other materials, such as molybdenum or copper, and the heat sink (not shown) may comprise another material having a high value of thermal conductivity.

The aperture 17 in one preferred embodiment has a cross-sectional dimension of about 90 µm×90 µm. However, the aperture 17 may have a cross-sectional dimension in a range of about 60 µm×60 µm to about 100 µm×100 µm.

The first beam element 15 can be arranged to produce a substantially 100 µm×100 µm square cross-sectional beam shape at a distance $S_a$ along the beam path 19. The first and second beam shaping elements 15, 16 are separated by the distance $S_a$ such that the aforementioned square-shaped beam generated by the first beam element 15 substantially coincides with the position of the aperture 17.

In some embodiments the beam shaping apparatus 7 can include the beam shaping element 15 without the beam shaping element 16 having aperture 17, or, alternatively, the beam shaping element 16 without the element 15. The beam shaping apparatus 7 can include a single beam shaping element, such as a single diffractive optical element.

In one embodiment of the invention, the fundamental laser output from the laser 3 typically comprises a substantially Gaussian $TM_{01}$ single spatial mode and is characterized by an $M^2$ value of less than 2.0, with a most preferred value of less than 1.3. The fundamental laser output mode is further characterized by a fundamental spectral fullwidth-at-half-maximum (FWHM) bandwidth $\Delta\lambda_F$, where $\Delta\lambda_F > 1$ nm. As those skilled in the art will recognize however, the fundamental spectral bandwidth of an UFMOFPA is substantially larger than that typically produced by a mode-locked diode-pumped solid state laser (not shown) or a Q-switched diode-pumped solid state laser (not shown) comprising a Nd:YAG, Nd:YLF, or Nd:YVO$_4$ solid state medium, as commonly employed in industrial pulsed solid state lasers.

As is noted above, the output from the UFMOFPA 1 can include an internal harmonic conversion module or can be optically coupled into an external harmonic conversion section 5. In either case there is produced a harmonic laser wavelength (e.g., a second harmonic wavelength), comprising a substantially Gaussian spatial profile having a FWHM $\Delta\lambda_{SH}$, which is substantially less than $\Delta\lambda_F$. In one practice of the system illustrated in FIG. 1 of the drawings, the laser wavelength output after harmonic conversion can be substantially 0.5 µm and this output can be optically coupled to beam conditioning section 6 arranged to cooperate to generate a substantially Gaussian beam waist diameter, before passing the beam to a beam shaping apparatus 7, which can comprise one or both of first and second beam shaping elements 15, 16. The beam shaping apparatus can comprise a beam shaping element having a spectral bandwidth that substantially corresponds with $\Delta\lambda_{SH}$ or $\Delta\lambda_{SH}$ can be at least as narrow as the spectral bandwidth of at least one beam shaping element. In other words, the spectral bandwidth of at least one beam shaping element can be greater than or equal to $\Delta\lambda_{SH}$.

In a preferred embodiment, the beam exiting the aperture 17 is passed to an imaging section 8. The imaging section 8 can include one or more imaging lenses, beam routing optics 22 and a delivery optics module 23. The imaging section 8 can produce a reduced-sized image 9 of the shaped beam at an image plane near or on a work surface 10 of the workpiece 2.

Regarding imaging lenses, the imaging section 8 can include an imaging lens 20 having a focal length $f_1$ as well as imaging lens 24 having focal length $f_2$. Imaging lens 20 is optional, and is preferably omitted, as is discussed in more detail below in conjunction with FIG. 5. In another embodiment, the optional imaging lens 20 is included, as is discussed below in conjunction with FIG. 6.

In an alternate embodiment, aperture 17 is omitted.

The beam routing optics 22 may include beam conditioning elements such as, for example, mirrors (not shown), beam splitting elements (not shown), beam modulation elements (not shown) and fast shutter devices (not shown) for delivering a shaped beam output to the delivery optics module 23. As those skilled in the art will recognize, based on the teachings herein, conventional telescopes may also be employed for changing the magnification of the shaped beam output in cooperation with imaging lens 24 or in cooperation with imaging lens 24 and optional lens 20.

The delivery optics module 23 may take the form of a galvanometer scan head equipped with a telecentric scan lens 24 for fast scanning operations.

Figure 3A:
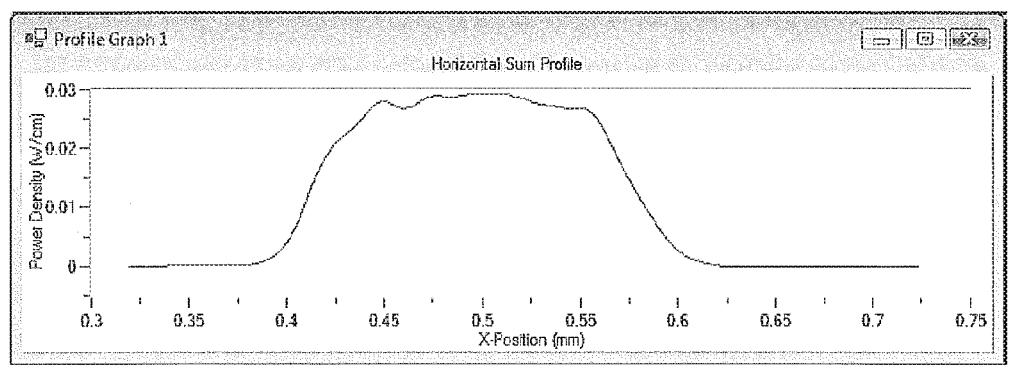
FIGS. 3a and 3b are 1-dimensional (1-D) intensity distributions taken along orthogonal axes of a beam having a substantially rectangular intensity profile.
Figure 3B:
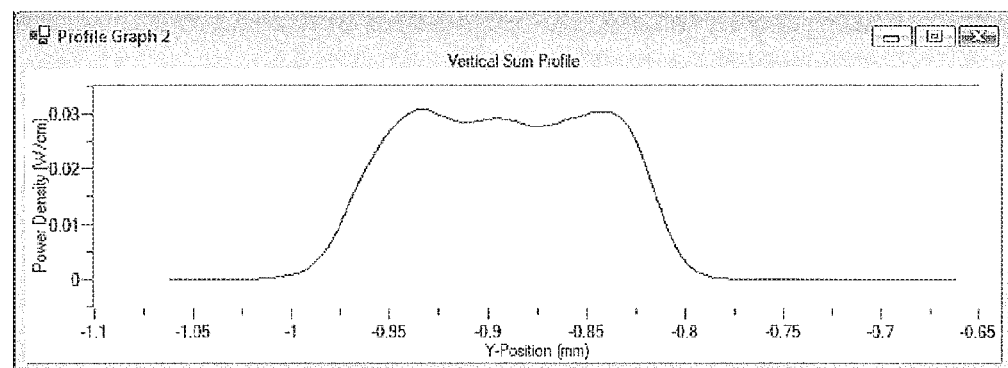

Referring in particular to FIGS. 3a and 3b, which are 1 dimensional (1-D) distributions taken across orthogonal axes (i.e., x and y axes), the density (denoted by the symbol $\Omega$) profile has a rapid fall off at the sides of the beam and a peak-to-trough ripple, $\Delta\Omega_{av}$, across the beam of less than 10% of the average beam density, $\Omega_{av}$. In some embodiments, the peak-to-trough $\Delta\Omega_{av}$ ripple across the beam is less than 5%.

A spatially non-Gaussian beam having steep sides and/or substantially uniform intensity profile can be characterized as to the steepness and/or the intensity uniformity by a comparison to a Gaussian spatial intensity distribution that is "fitted" to an intensity distribution of the non Gaussian beam in terms of the intensity at the beam center and at a selected radial distance from the beam center. Consider FIG. 3c, which illustrates fitting a hypothetical Gaussian 1 dimensional (1-D) spatial intensity distribution 325 to the 1-D spatial intensity distribution of a spatially non-Gaussian beam 330. The non Gaussian spatial intensity distribution can represent a 1-D intensity distribution of a beam according to the disclosure having a substantially rectangular beam profile and substantially uniform intensity. Such a beam would have two orthogonal 1-D intensity distributions that each, though not necessarily substantially identical (e.g., in radial extent if the beam were not square), would look like the intensity distribution 330 shown in FIG. 3c.

The hypothetical Gaussian can be fitted to the non-Gaussian 1-D intensity distribution 325 using the parameters $I_o$ and $r=w$ and the formula $I(r)=I_o e^{-2(r/w)^2}$, where $I_o$ is the intensity at the center of the beam (e.g., at 340), and where w is distance from the center at which the intensity of the non-Gaussian intensity distribution 330 drops to $I_o/e^2$ where, as indicated by reference numeral 352, the two distributions are set to be equal. The difference between the non-Gaussian intensity distribution 330 and the Gaussian intensity distribution 325 can be illustrated by the difference between the two at a radius or distance from the center that is less than $r=w$. The non-Gaussian 1-D intensity distribution 330 of the present disclosure can have an intensity $I_{NG}$ at a radius $r=w/2$ (see reference numeral 360) that is greater than the intensity $I_G$ of the hypothetical beam profile at $r=w/2$ (see reference numeral 365). According to different practices of the invention, $I_{NG}$ can be at least 1.35 times $I_G$; at least 1.4 times $I_G$; at least 1.45 times $I_G$ o; at least 1.5 times $I_G$; or at least 1.55 times $I_G$. Alternatively or additionally, the non-Gaussian 1-D intensity distribution can also be greater than the hypothetical fitted Gaussian distribution at the distance $r=2w/3$. For example at $r=2w/3$, the intensity of the non-Gaussian intensity distribution can be at least 1.9, at least 2.0, at least 2.1, at least 2.2, at least 2.3 or at least 2.4 times the intensity of hypothetical fitted Gaussian the same location from the center.

Figure 3C:
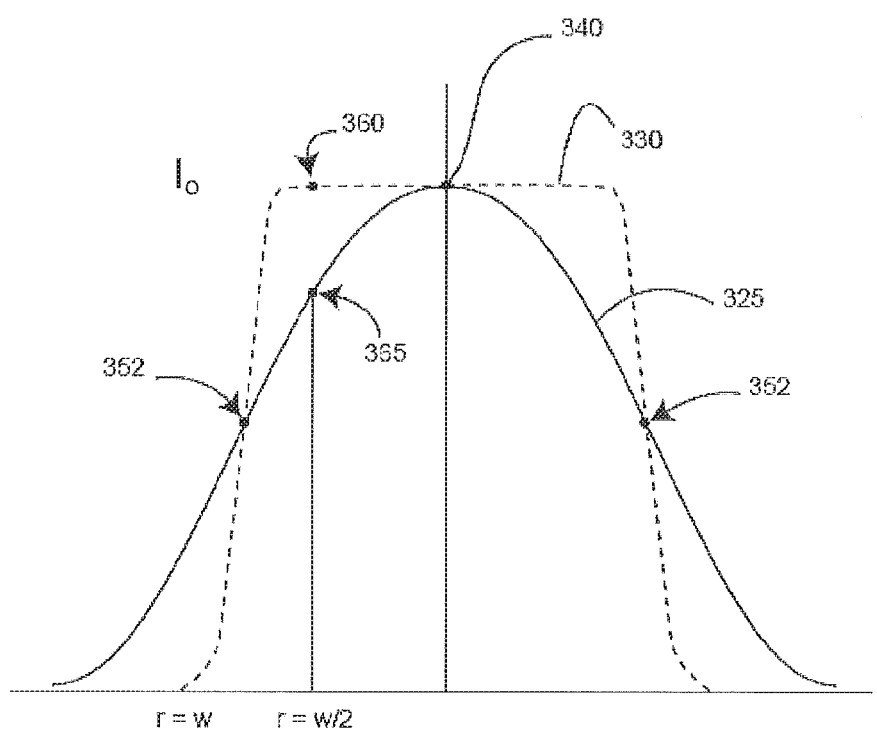
FIG. 3c illustrates fitting a hypothetical Gaussian 1-D intensity distribution to the 1-D intensity distribution of a non-Gaussian beam for comparison therewith.
Figure 4A:
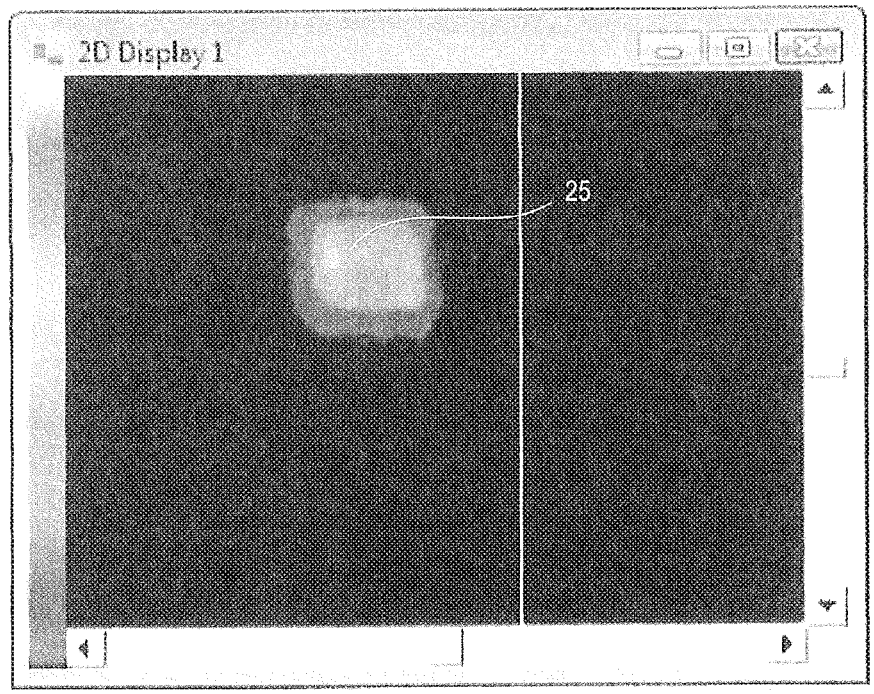
FIG. 4a is an image of a spatially shaped picosecond pulsed laser beam.
Figure 4B:
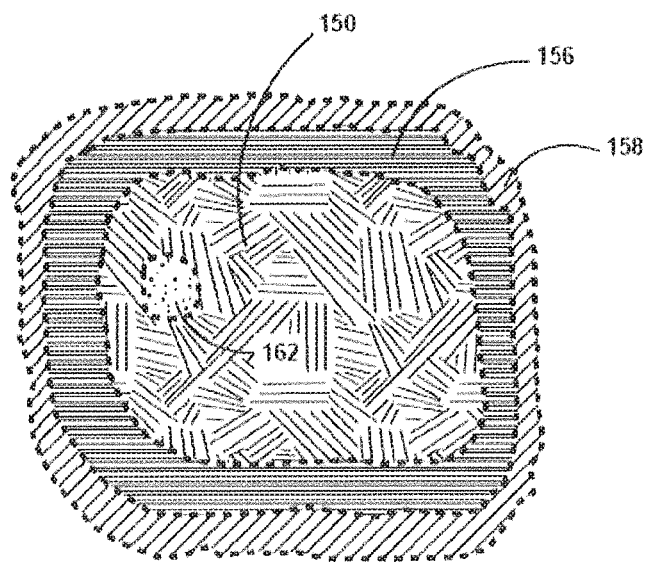

The peak to trough intensity variation of the non-Gaussian 1-D intensity distribution 330 for the section bounded by $r=w/2$ as defined by the hypothetical Gaussian intensity distribution can be less that a selected percentage of the average intensity of the non-Gaussian beam within those points. For example, in certain practices of the disclosure, the peak to trough variation can be less than 15%; less than 10%; or less than 7.5% of the average intensity within those points. In certain embodiments, the foregoing recitations relating to the percentage of the average represented by the peak to trough variation can apply to the non-Gaussian 1-D intensity distribution over the section bounded by the $r=2w/3$ points FIGS. 4a and 4b illustrate an image of a spatially shaped beam 25. The image is taken at the image plane (see image plane 27 in FIGS. 5 and 6, to be subsequently discussed), which, as noted above, is typically located on or near the worksurface 10 of the workpiece 2. The image was taken using a Spiricon Ophir Beamstar camera available from Spiricon GmbH, Ahrensburg, Germany. As shown in FIG. 4a, the output of the laser 3 emitting at 532 nm can be shaped to produce a substantially square output beam from the laser system 1. FIG. 4b is a schematic illustration of some of the contours of the image profile of FIG. 4a, and was made using the photo of FIG. 4a and mapping the beam profile contours using a commercially available illustration software package. The Spiricon provides a color image (not reproducible here) where red represents higher intensity, yellow lower than red, green a lower intensity than yellow, blue lower than green, and purple lower than blue. With reference to FIG. 4b, region 150 was mostly green with some yellowish, with one more yellowish section 162; region 165 was blue, and region 158 was purple. FIG. 3c, and the recitations noted in the discussion thereof regarding characterization of the 1-D intensity distribution of a non Gaussian beam, such as a spatially shaped beam, relative to that of a Gaussian beam, can apply to the spatially shaped beam as delivered to the workpiece 2 the processing thereof.

Figure 5:
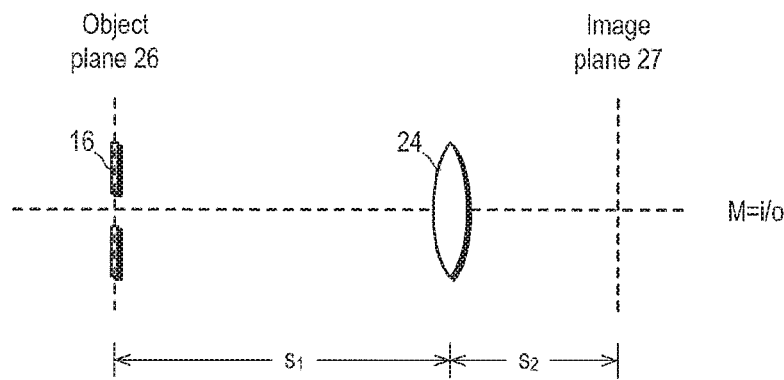
FIG. 5 schematically illustrates one approach for forming an image in an image plane of an aperture located in an object plane.

As noted above, and with reference to FIG. 1, the imaging section b can include imaging lens 24 with or without optional imaging lens 20. FIG. 5 schematically illustrates the embodiment wherein the optional imaging lens is not present. The reduced size image 9 of FIG. 1, which is formed at the image plane 27 (not shown in FIG. 1) can comprise a demagnified image of the shaped beam output at aperture 17. The demagnification ratio is about $s_2/s_1$ where $s_1$ indicates the distance from object plane 26, which in a preferred embodiment corresponds to the position of aperture 17, to the imaging lens 24 and $s_2$ indicates the distance from imaging lens 24 to image plane 27, which is on or near the work surface 10.

Figure 6:
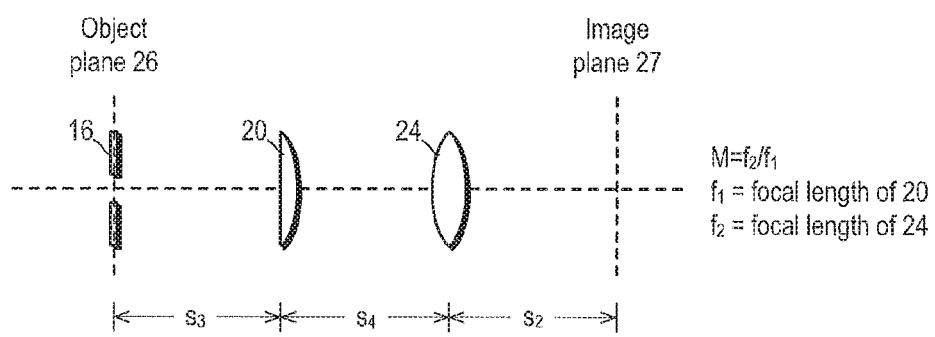
FIG. 6 schematically illustrates another approach for forming an image in an image plane of an aperture located in an object plane.

As schematically illustrated in FIG. 6, in an alternative embodiment the optional imaging lens 20 is employed. The distance $S_3$ from aperture 17 to first imaging lens 20 can be set to be about the focal length $f_1$ of imaging lens 20. The imaging lens 24 can have a focal length $f_2$, and the distance $S_3$ shown in FIG. 6 can be set to be substantially equal to $f_2$. As those skilled in the art will appreciate, in this case the reduced size image 9 (see FIG. 1) will be demagnified by the ratio of the focal lengths of the imaging lenses $f_2/f_1$.

The imaging section 8 can be configured such that the reduced-sized image of aperture 17 produced at the image plane 27 with a magnification factor of about 0.4.

With reference to FIG. 1 and the embodiments shown in FIGS. 5 and 6, imaging lens 20 can have a focal length $f_1$ of 250 mm and the imaging lens 24 can have a focal length $f_2$ of 100 mm.

More generally, the focal length $f_1$ of imaging lens 20 may lie in a first range of about 50 mm to about 500 mm and the focal length, $f_2$, of the imaging lens 24 may lie in a second range of about 25 mm to 300 mm. A combination of focal lengths $f_1$ and $f_2$ in these ranges may provide an advantageous range of image size. The imaging lens 20 may be a single or multi-element lens. The imaging lens 24 may be a multi-element lens. As mentioned earlier, the imaging lens 24 may be a telecentric or non-telecentric scan lens.

Figure 7A:
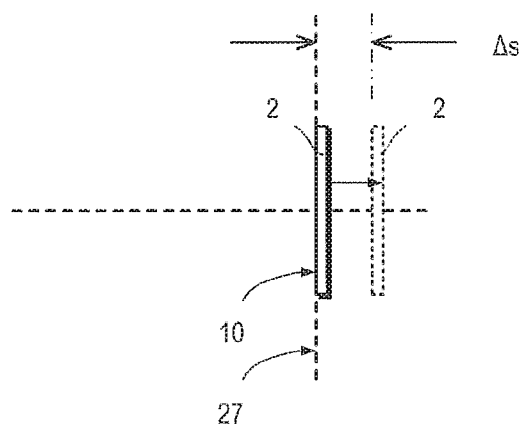
FIGS. 7a and 7b schematically illustrate movement of a workpiece relative to an image plane.
Figure 7B:
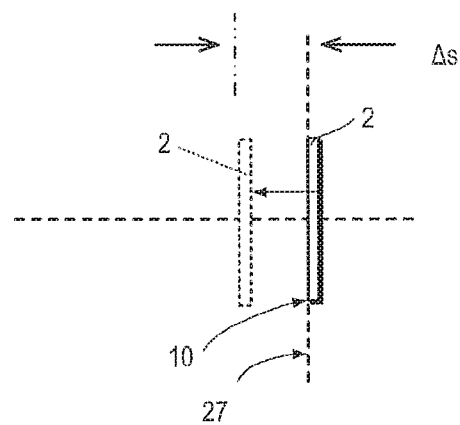

With reference to FIGS. 7a and 7b, the workpiece 2 may be placed so that a working surface 10 of the workpiece 2 coincides with the image plane 27. Thus, a reduced-sized image is formed on the working surface 10. However, as indicated in FIG. 7a, the workpiece may be displaced by ΔS so as to be optically downstream of the image plane, or alternatively as shown in FIG. 7b, so as to be optically upstream of the image plane.

This displacement can have the effect of changing the spatial size of the beam at the working surface 10 and/or the fluence at the working surface 10, and can be effected by changing the separation between the workpiece 2 and the delivery optics module 23 (and hence imaging lens 24). The separation can be changed by changing the position of one or both of the imaging lens and the workpiece 2/working surface 10. Thus, moving the delivery optics module 23 (and hence imaging lens 24 of FIG. 1) and/or the workpiece 2 can be used to change the spatial size of the beam and, thus, its fluence.

Figure 8:
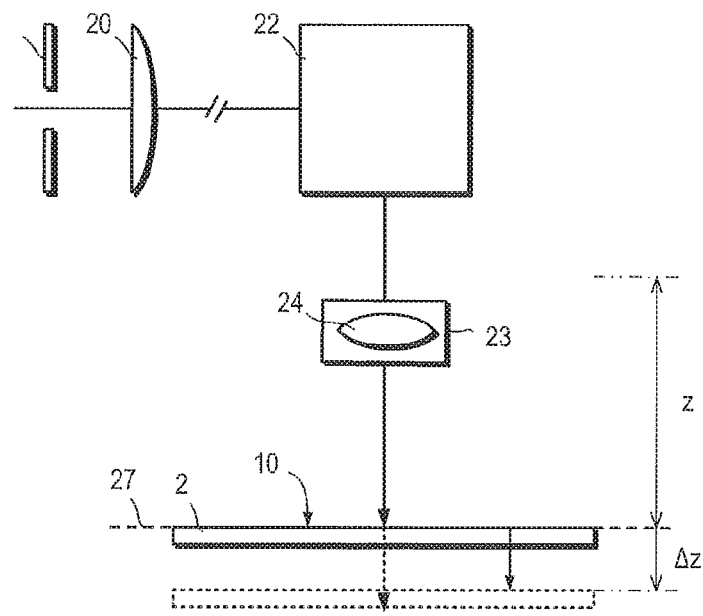
FIG. 8 schematically illustrates movement of a workpiece to increase separation between an imaging lens and the workpiece.

Referring to FIG. 8 the workpiece 2 can be moved such that the working distance z (the optical distance between the imaging lens 24 and the workpiece 2) can be increased or decreased by a distance, Δz. This in effect can displace the working surface 10 and workpiece 2 from the image plane 27, as noted above in the discussion concerning FIGS. 7a and 7b For the alternative embodiment where imaging lenses 20 and 24 work together, the magnification is in principle set by f2/f1. Moving the imaging lens 24 (via movement of the delivery optics module 23) with respect to the workpiece 2 such that the working surface 10 is not at the image plane 27b can result in processing the workpiece 2 at a z position that is "offset" from the image plane 27 and the resultant beam profile on the working surface will deviate from the "best" image of the beam profile at the aperture. The spatial size of the beam will be different.

Thus, the stage 11 (FIG. 1) and the delivery optics module 23 (FIG. 1) can be used not only for scanning and stepping operations, but also for changing the beam profile and size on the workpiece 2. This can be used to further control the spatial extent of a beam and its fluence.

A computer system (not shown) can be used to control the laser 3 (FIG. 1), stage 11 (FIG. 1) and delivery optics module 23 (FIG. 1) dynamically so as to remove selective areas of a photovoltaic layer structure and form a succession of terraces. In particular, the system 1 (FIG. 1) can be used for P3 and/or isolation scribing of a chalcopyrite-type semiconductor device.

Figure 9:
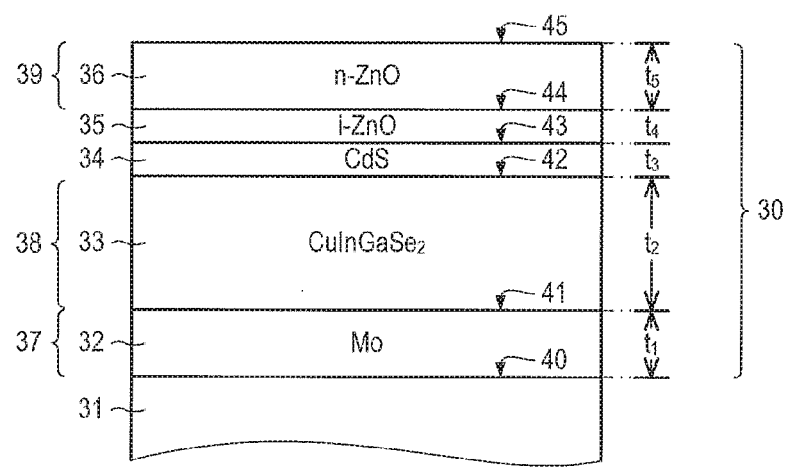
FIG. 9 shows one example of a photovoltaic device layer structure.

FIG. 9 shows one example of a photovoltaic device layer structure 30.

The layer structure 30 is formed on a substrate 31. The layer structure 30 comprises a stack of layers 32, 33, 34, 35, 36 and provides a first electrode 37, a light absorber 38 and a second electrode 39. The first electrode 37 is closest to the substrate 31 and the second, transparent electrode 39 is furthest from the substrate 31 and can be referred to as the "bottom electrode" and "top electrode" respectively.

The substrate 31 has top surface 40 above which is disposed a layer 32 of molybdenum having a thickness, $t_1$, in a range of about 0.3 to 1.0 µm. However, the molybdenum layer 32 can be thinner or thicker and may, for example, have a thickness $t_1$ in a range of about 0.1 to 1.5 µm. The molybdenum layer 32 provides the bottom electrode 37.

The molybdenum layer 32 has a top surface 41 on which is disposed a layer 33 of a chalcopyrite-type semiconductor having a thickness, $t_2$, in a range of about 0.5 to 3.5 µm. In this example, the chalcopyrite-type semiconductor is copper indium gallium diselenide ($CuInGaSe_2$).

The chalcopyrite-type semiconductor layer 33 has a top surface 42 above which is disposed a layer 34 of cadmium sulphide (CdS) having a thickness, $t_3$, of about 500 Å which provides a first buffer layer.

The first buffer layer 34 has a top surface 43 above which is disposed a layer 35 of intrinsic zinc oxide (ZnO) having a thickness, $t_4$, of about 500 Å which provides a second buffer layer.

The second buffer layer 35 has a top surface 44 above which is disposed a layer of zinc oxide (ZnO) doped with aluminium having a thickness, $t_5$, of about 350 to 500 µm.

The layer structure 30 is patterned using a series of scribes, usually referred to as P1, P2 and P3 scribes and, optionally an isolation scribe, to form a device.

P3 and isolation scribing of the layer structure 30 using the system 1 will now be described in more detail.

Figure 10A:
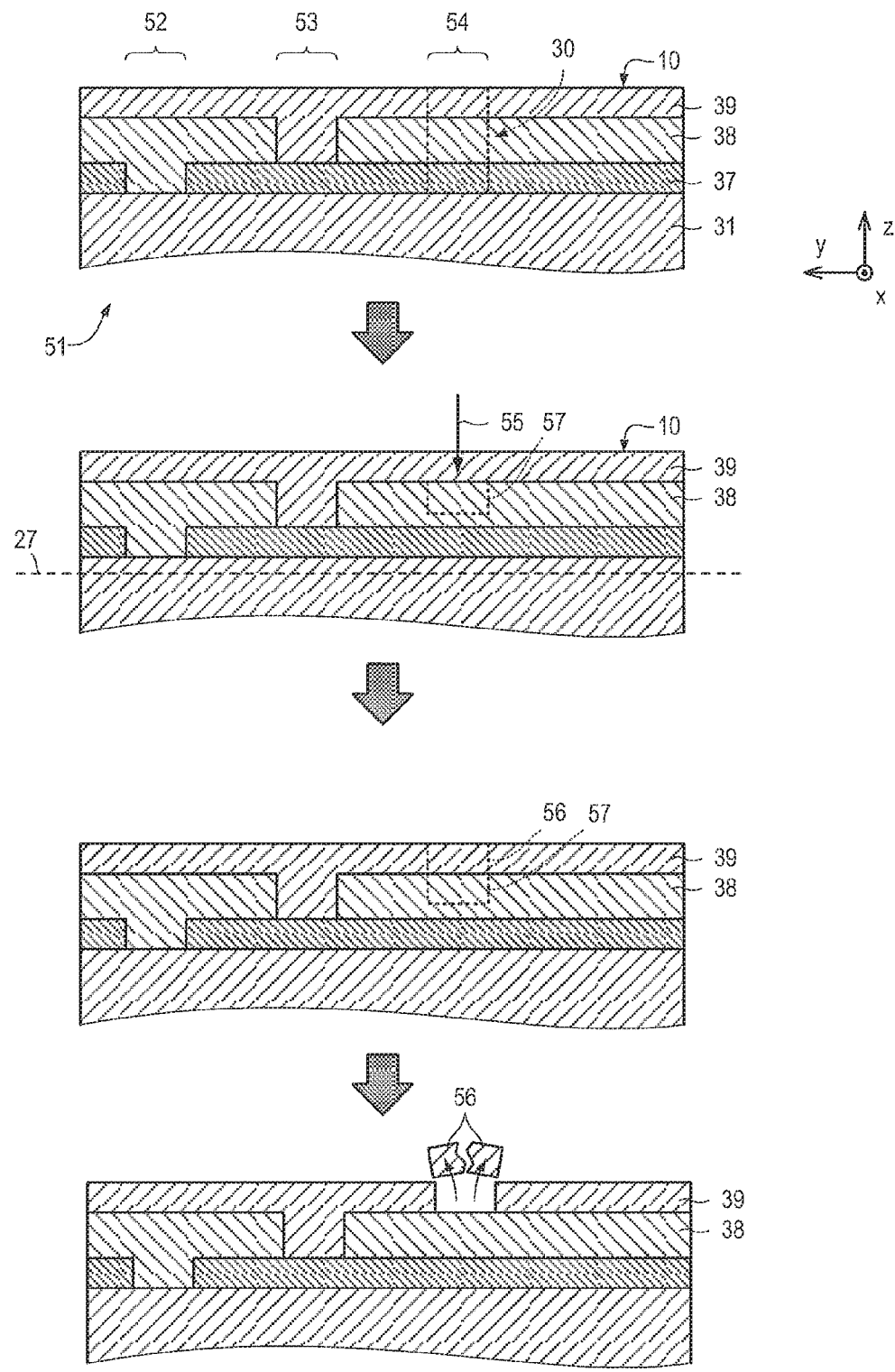
FIG. 10a schematically illustrates selective removal of material from a transparent electrode using the system shown in FIG. 1 during a first stage of a P3 scribe.

Referring to FIG. 10a, a partly-processed device 51 is shown. In a first area 52 of the partly-processed device 51, the bottom electrode 37 has been scribed using, for example, a conventional P1 scribe. Thus, the light absorber 38 lies directly on the substrate 31 in the first area 52. In a second area 53 of the partly-processed device 51, the light absorber 38 has been removed using, for example, a conventional P2 scribe. Thus the transparent top electrode 39 lies directly on the bottom electrode 37 in the second area 53. In a third area 54 of the partly-processed device 51, the device 51 has the layer structure 30 substantially as shown in FIG. 9. In some embodiments, a different layer structure may be used, but which includes an electrode, a light absorber and a transmissive electrode.

In certain embodiments, the P3 scribe can be carried out in two stages (hereinafter referred to as "P3A" and "P3B" scribes), as will now be described in more detail.

P3A Scribe

Referring still to FIG. 10a, a first spatially-shaped picosecond pulsed laser beam 55 is directed substantially perpendicularly to the surface of the layer structure 30. The laser beam 55 has a first set of beam characteristics including wavelength, pulsewidth, pulse repetition frequency, beam shape and dimensions, and fluence so as to remove a region 56 of the transparent top electrode 39 while leaving substantially intact an underlying region 57 of the light absorber 38.

In this example, the beam 55 has a wavelength of about 0.5 µm, and in a preferred embodiment of about 532 nm, a pulsewidth of about 30 µs and a pulse repetition frequency of about 200 kHz. The beam 55 as a substantially square profile and has a substantially uniform intensity across the beam. In some embodiments, the beam may be rectangular but not square. In an alternate embodiment, the beam 55 has a wavelength of about 0.3 um. In one alternate embodiment, the wavelength of beam 55 is about 355 nm.

The first beam 55 has a dimension transverse to the scribe direction (in this example, the scribe direction is along the x-axis) of 80 µm at the work surface 10. Typically, the desired P3 beam width lies in a range of about 10 µm to 100 µm, although a wider range can be used, for example about 20 µm to 150 µm.

As shown in FIG. 10a, the first beam 55 may produce a larger beam profile at the work surface 10 by arranging the device 51, i.e. workpiece 2, and scan head 23 (FIG. 1) so that the work surface 10 and the image plane 27 do not coincide. For example, the work surface 10 may be selected to lie above the image plane 27 as shown in FIG. 10a.

The fluence of individual pulses, which may be optionally amplitude modulated, at the work surface 10 is chosen to be below the ablation threshold of the light absorber 38. In this case, the fluence is about 0.2 J/cm$^2$. The fluence can be in a range of about 0.1 to about 3 J/cm$^2$, although the fluence can lie in a range of about 0.05 J/cm$^2$ to about 5 J/cm$^2$. A plurality of scribing passes may be employed.

Without wishing to be bound by a particular theory, it is thought that a region 56 of the transparent electrode 39 can be removed while substantially leaving intact the underlying region 57 of the light absorber 38. The beam 55 passes through the top, transparent electrode 39 (without being substantially absorbed) and into a region 57 of the light absorber 38 where it is absorbed. This light absorber region 57 heats up and expands causing the overlying region 56 of the top, transparent electrode 39 to crack and come away from the rest of the electrode 39.

Figure 10B:
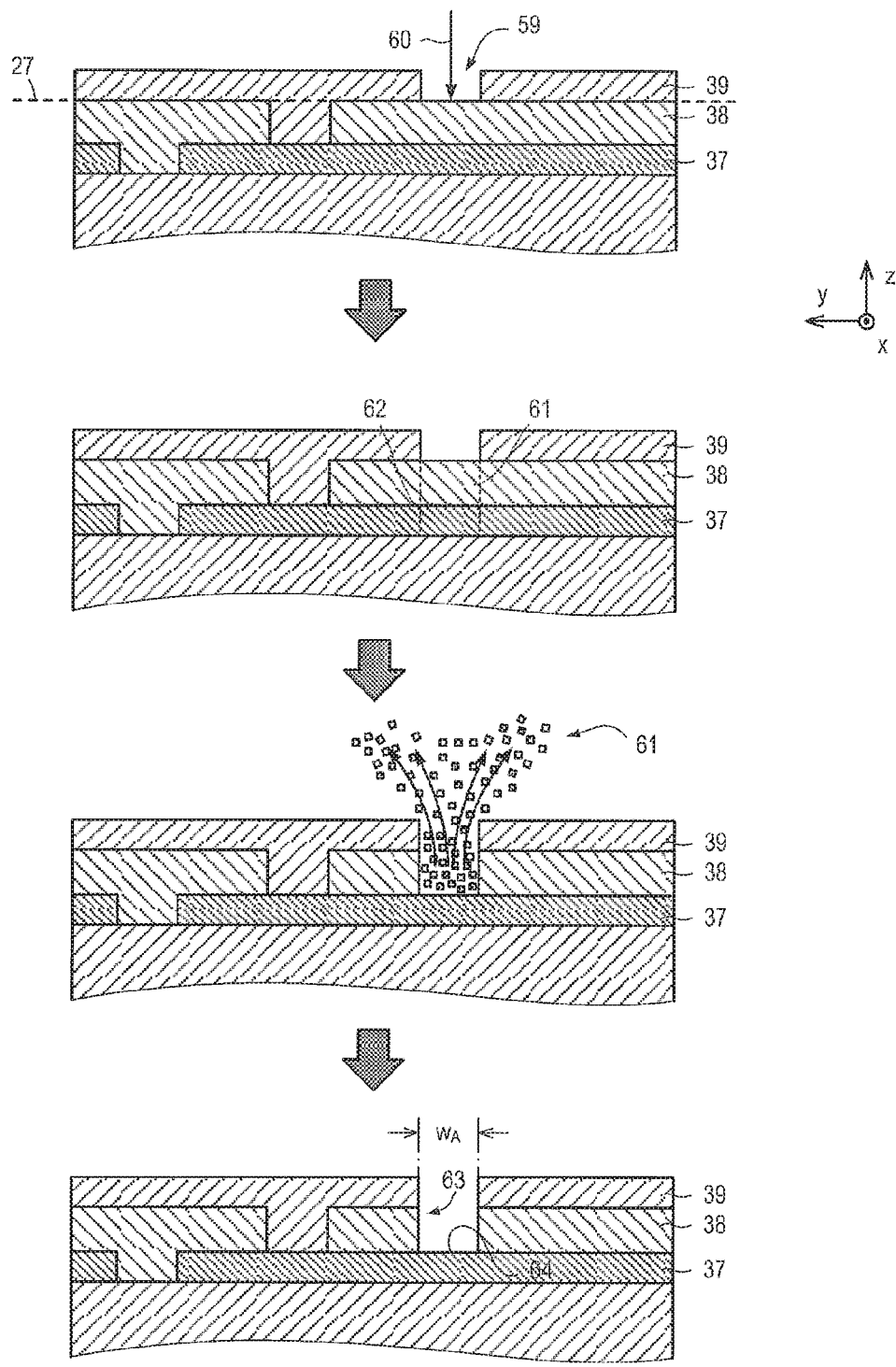
FIG. 10b schematically illustrates removal of material from a light absorber using the system shown in FIG. 1 using one approach to performing a second stage of a P3 scribe.

As shown in FIG. 10b, this process opens up a scribe line or scribe channel 59 in the top, transparent electrode 39. The scribe channel 59 can have a width W$_A$ that may range from about 60 to 120 µm, although the range may be wider, for example, about 40 µm to about 160 µm. The width of the beam 55 can be selected to provide the foregoing widths, typically by having substantially the same width as the desired scribe channel. In other practices of the disclosure, the width W$_A$ can range from just above 0 µm to 100 µm, although a wider range can be used, for example about 20 µm to 150 µm. Ranges as stated herein include endpoints.

P3B Scribe

A second spatially-shaped picosecond pulsed laser beam 60 is directed through the window 59. The second laser beam 60 has a second set of beam characteristics so as to remove a region 61 of the light absorber 39 while substantially leaving intact an underlying region 62 of the bottom electrode 37.

The second laser beam 60 may be substantially configured to have the same characteristics as the first laser beam 55 (FIG. 10a) but may have a smaller spatial profile, thereby resulting a higher fluence. This may be achieved by reducing the working distance, z, and making the working surface 10 and image plane 27 substantially coplanar. In other embodiments, additional pulse energy may be supplied through increasing transmission of an amplitude modulation element. In the embodiment shown in FIG. 10a, the second laser 60 beam may have substantially the same spatial profile as first laser beam 55, though this is not a preferred embodiment, as is explained in more detail below.

The spatially shaped second laser beam 60 has a fluence value which exceeds the ablation threshold of the light absorber 38, but which is preferably chosen to be below the ablation threshold of the bottom or first electrode 37. A plurality of scribing passes can be made. Thus, material from the region 61 of the light absorber 39 is selectively removed.

Applicants have discovered that the ablation threshold for chalcopyrite type semiconductor light absorbers (e.g., for a CIGS light absorber) can be lower than that of adjacent or underlying electrode material (i.e., molybdenum), as demonstrated using a spatially shaped beam having a rectangular beam profile or shape. The difference between the ablation thresholds (sometimes referred to herein as ablation threshold "contrast") can be quite small, but still large enough to be useful to exploit, if one knows the threshold for light absorber 38 and the threshold contrast. Choosing the fluence of beam 60 so as to be greater than the ablation threshold of the light absorber 38 but less than that of the underlying first electrode 37 can allow improved removal of the photovoltaic light absorber 38 without substantially detrimentally affecting the underlying electrode. For example, a surface of the underlying first electrode 37 can be exposed and/or substantial removal of the electrode 37 can be avoided. The difference between the ablation thresholds can be less than, for example, 10%, 20%, 14%, 10%, 8%, 5% or 3% of the ablation threshold of the photovoltaic light absorbing region 38. In absolute terms, the contrast can be greater than about 0.01 J/cm$^2$ and less than about 0.1 J/cm2. The contrast can be on the order of about a tenth of a Joule/cm$^2$ Thus although the fluence of the beam 60, which removes photovoltaic light absorber material, is increased to be larger than that of the beam 59, which removes upper electrode material, the increase is preferably controlled so as to be within the contrast and less than the ablation threshold of the underlying electrode, which can provide for an automatic limit on the scribe channel depth—the beam 60 does not penetrate far, if at all, into the first electrode 37. Scribe channel depth need not be so closely monitored, if at all, or the number of scribe passes so closely controlled, again, if at all, to avoid milling the first electrode 37. If the fluence of beam 60 were above both thresholds, the process could be more difficult to control.

The ablation threshold for the photovoltaic light absorber (e.g., region 38) can be, in various practices of the invention, not greater than 0.08 J/cm$^2$, 0.10 J/cm$^2$; 0.12 J/cm$^2$; 0.14 J/cm$^2$; 0.16 J/cm$^2$; or 0.18 J/cm$^2$. The fluence of the beam 59 can be limited accordingly, if desired, to the foregoing limits. The fluence of the beam 60 can then be increased but limited so as to be no greater than 1.2; no greater than 1.15, no greater than 1.4; no greater than 1.1; not greater than 1.08; no greater than 1.05; or no greater than 1.03 times the fluence of the beam 59. This can allow the fluence of the beam 60 to remain within the ablation contrast.

A spatially-shaped beam 60, particularly one which is substantially spatially uniform across the beam, can help to ensure that the beam intensity across the beam is kept below the ablation threshold of the bottom electrode 37. Moreover, if the beam 60 has sharp edges, then this can help to maximise verticality of the resulting side wall 63 and reduce undesirable sidewall melting and resultant electrical shunts.

One or both of the beams 55 & 60 can have a wavelength in any of the ranges stated for laser processing or scribing beams stated herein. In one embodiment the beams have a wavelength in the range of 400 nm-600 nm, and often about 532 nm. In another embodiment, in which the laser wavelength may be preferably less than 0.4 µm but greater than 0.2 µm, with a most preferred wavelength of about 0.35 µm, formation of the scribe line or channel involves removing substantially all the transparent electrode 39 and light absorber 38 and terminating near the top of the bottom electrode 37 and/or exposing a surface of the bottom electrode. The laser beam 55 used for scribing the transpired electrode 39 can have a different wavelength than that of the beam 60. For example, the beam 55 can have a wavelength of about 350 nm and the beam 60 can have a wavelength of about 532 nm.

Terraced Processing

As noted above, the process shown in FIG. 10b is not necessarily preferred in all circumstances. With reference to FIGS. 10a and 10b, the P3A and P3B scribe channels, which together make up the overall scribe channel running into and out of the page in the bottommost cross section shown in FIG. 10b, can have the same width W₁, which is also the width of the overall scribe line. Any debris or melt product formed, for example, at the interface between the top or second electrode 39 and the light absorption layer 38 could run down the substantially vertical and continuous side wall 63 and possibly form a conductive or partially conductive bridge between the top or second electrode 39 and the exposed surface 64 of the bottom electrode 37. This, of course, is detrimental and undesired, and can lead to higher rejection rate during manufacture. It is not necessarily clear that this design would be substantially detrimental and hence would render photovoltaic devices so made impractical for deployment in the field. However, in general it is desired to use processes with potential for higher yield and fewer defects.

Because light beams 55 and 60 can have substantially the same spatial width (e.g., FWHM spatial width) the light beam 60 can touch or affect the part of the vertical sidewall 63 defined by the second or top electrode 39 as well as the interface along the sidewall 63 between the light absorber 38 and top or second electrode 39, causing melting at or near interface, reflow of deposited debris, etc., which can lead to the conductive bridging along the sidewall 63 between the vertical surface of the top electrode 39 and the bottom electrode 37.

Figure 10C:
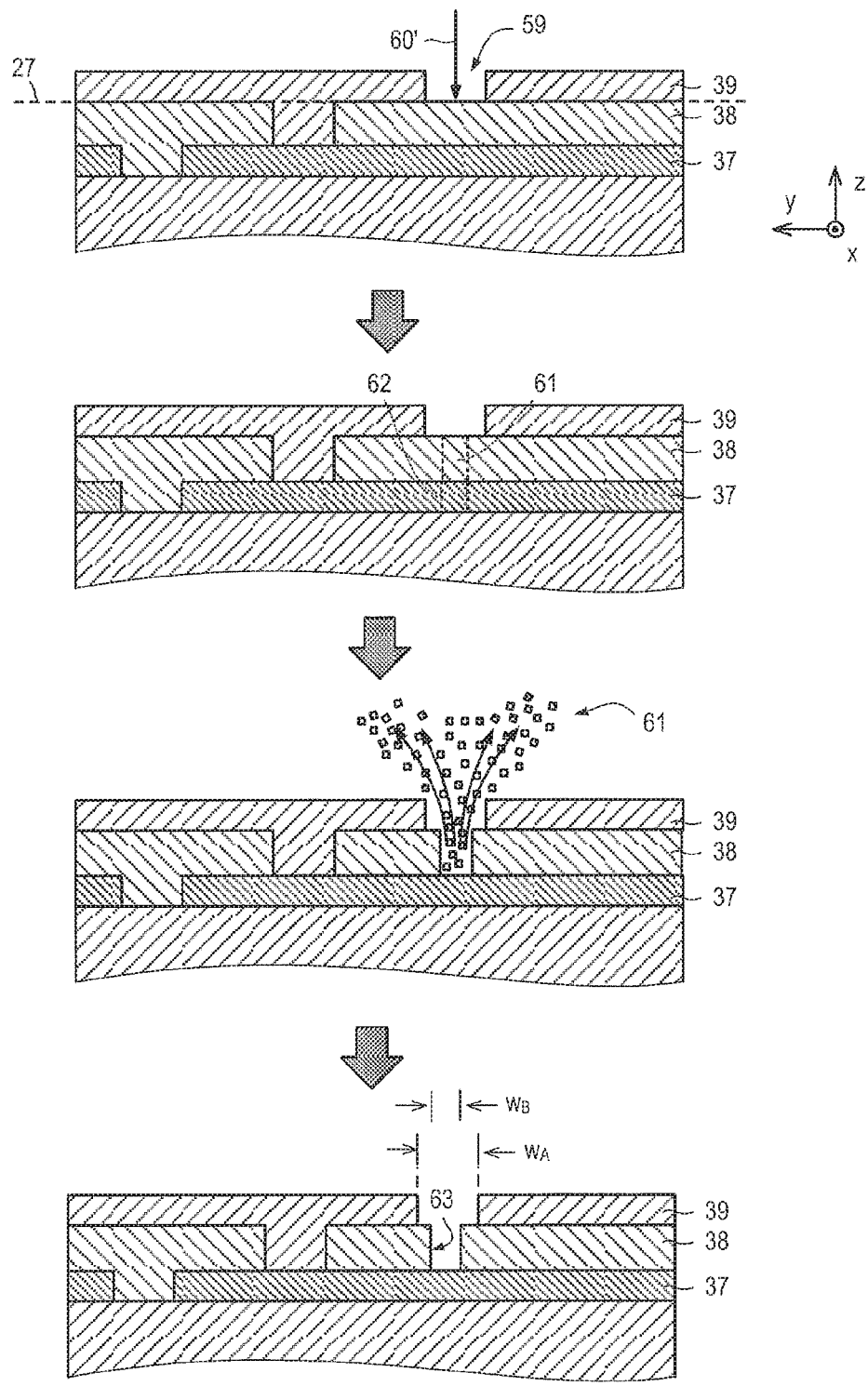
FIG. 10c schematically illustrates removal of material from a light absorber using the system shown in FIG. 1 using a preferred "terraced" approach to performing a second stage of a P3 scribe.

Accordingly, in a preferred practice of the disclosure, as schematically illustrated in FIG. 10c, the P3B beam 60' (see FIG. 10c) has a smaller beamwidth than the P3A beam 55 (see FIG. 10a) such that the P3A scribe formed in the top or second electrode 39 has width $W_A$ that is wider than the width $W_B$ of the P3B scribe in the absorbing region 38. The narrower P3B scribe channel can be substantially centred with respect to the wider P3A scribe channel. The beams 60' and 55 can share a common vertical optical axis.

Figure 10D:
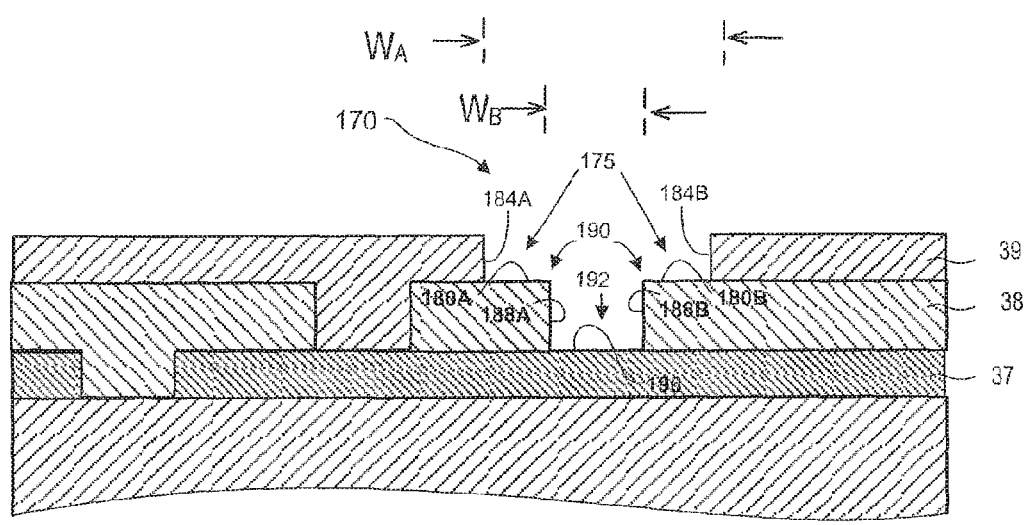
FIG. 10d illustrates in more detail a P3 scribe performed as shown in FIGS. 10a and 10c.

The narrower P3B scribe, as shown in FIG. 10c, can have at least two advantages. First, the former side wall 63 is now interrupted by a horizontal section, which can impair the undesired conductive bridging. Secondly, the light beam 61' used for the P3B scribe process is less likely to reach the sidewalls of the second electrode 39 or the interface between the second electrode 39 and the light absorber region 38, reducing the likelihood of generating conductive bridging material during the P3B scribe. FIG. 10d is an enlarged view that more readily allows for more detailed discussion.

With reference to FIG. 10d, a scribe channel or line extending 170 into and out of the page can be considered to comprise a first scribe channel (P3A scribe) having a width $W_A$ and a second scribe channel (P3B scribe) having a width $W_B$. The second scribe channel opens into the first scribe channel. The scribe line 170 comprises terraces 175 and 192. Terraces 175 comprise typically substantially horizontal (in FIG. 10d) walls 180A and 180B, each of which typically comprises a surface of the light absorber 38 exposed during the P3A scribe process. Terrace 192 can comprise wall 196, which can include a surface of the first electrode exposed as part of the removal or light absorber material by the P3B scribe.

The scribe channel can further comprise opposing and substantially vertical sidewalls 184A and 184B, respectively, each which typically includes a surface of the second electrode 39 exposed during the P3A scribe, as well as opposing and substantially vertical sidewalls 188A and 188B, each of which can include a vertical surface of the light absorber 38 exposed during the P3B scribe process. The sidewalls 184A and 184B can face each other across the scribe channel 170, and define the width of the first, or P3A, scribe channel and, at least in part, the width of the scribe channel. The sidewalls 188A and 188B can face each other across the scribe channel 170, and define the width of the second, or P3B, scribe channel and, at least in part, the width of the scribe channel.

The scribe channel 170 also includes a pair of terrace shoulders 190 on opposing sides of the scribe channel. The terrace shoulders 190 can comprise opposing outside corners formed by the wall 180A and sidewall 188A and by the wall 180B and the sidewall 188B.

The wall 180A can form an inside corner at one its ends where it meets with sidewall 184A and an outside corner of the terrace shoulders 192 the other of its ends where it meets with sidewall 188A. The wall 180B can form an inside corner at one of its ends where it meets with sidewall 184B and the other outside corner of terrace shoulders 192 at the other of its ends where it meets with sidewall 188B.

The sidewall 188A can form an inside corner where it meets with one end of the wall 196 of the terrace 192 and the sidewall 188B can form an opposing inside corner where it meets with the other end of the wall 196 of the terrace 192. The wall 196 can comprise a substantially horizontal surface of first electrode 37, which surface can have been exposed during the P3B scribe process.

Horizontal and vertical are not used in their absolute senses but to indicate which walls are typically substantially orthogonal to each other in a preferred embodiment of the disclosure. Although horizontal and vertical walls and surface that are substantially orthogonal are shown in FIG. 10a, there is no requirement that such walls and surface be vertical, horizontal or orthogonal. As an example, it can simply be stated more generally that wall 180A extends between one end of the sidewall 184A defined by the second electrode 39 and an end of the sidewall 184A defined by the light absorber 38. And the wall 180B extends between one end of the sidewall 184B defined by the second electrode 39 and an end of the sidewall 184B defined by the light absorber 38. The walls 180A and 180B preferably meet the other walls at an angle.

Alternative P3 Scribe

Figure 10E:
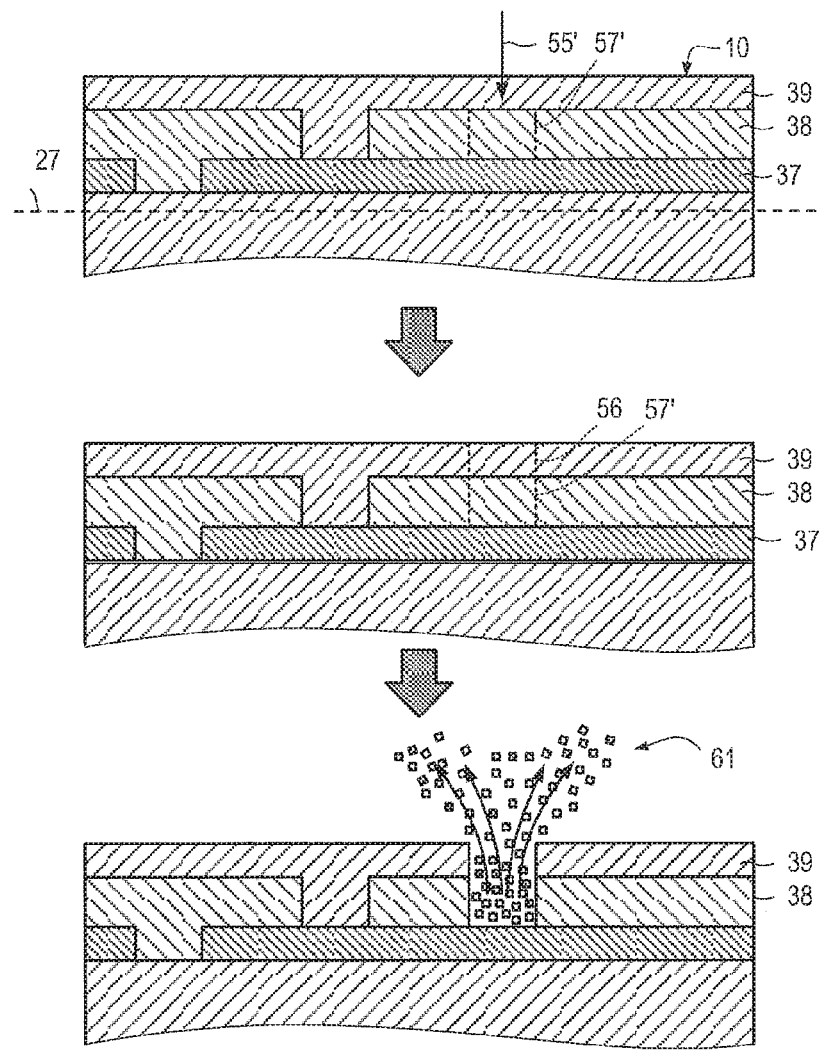
FIG. 10e schematically illustrates another approach to performing a P3 scribe.

FIG. 10e schematically illustrates another approach to performing a P3 scribe. The process can be performed as described as regards FIG. 10a-10d, for example, with the caveat (or reminder, as this feature is describe earlier as well) that beam 55' can have a fluence that is higher than the ablation threshold of the absorber 38 (but typically less than the ablation threshold of the first electrode 37). Beam 55' is directed through the transparent second electrode 39 and is absorbed in the region 57' of the photovoltaic light absorber 38. The material of the region 57' is ejected, and in the process of being ejected ejects region 56 of the transparent second electrode as well, as indicted by reference number 61. A terraced scribe is preferred for some materials, as it may provide higher quality scribes, though the terracing process can be time consuming and laborious. The process shown in FIG. 10e can be faster.

The beam can have a wavelength in any of the ranges stated for laser processing or scribing beams stated herein. In one embodiment the beam 55' has a wavelength in the range of 400 nm-600 nm, and often about 532 nm. In another embodiment, in which the laser wavelength may be preferably less than 0.4 μm but greater than 0.2 μm, with a most preferred wavelength of about 0.35 μm, formation of the scribe line or channel involves removing substantially all the transparent electrode 39 and light absorber 38 and terminating near the top of the bottom electrode 37 and/or exposing a surface of the bottom electrode.

Figure 11:
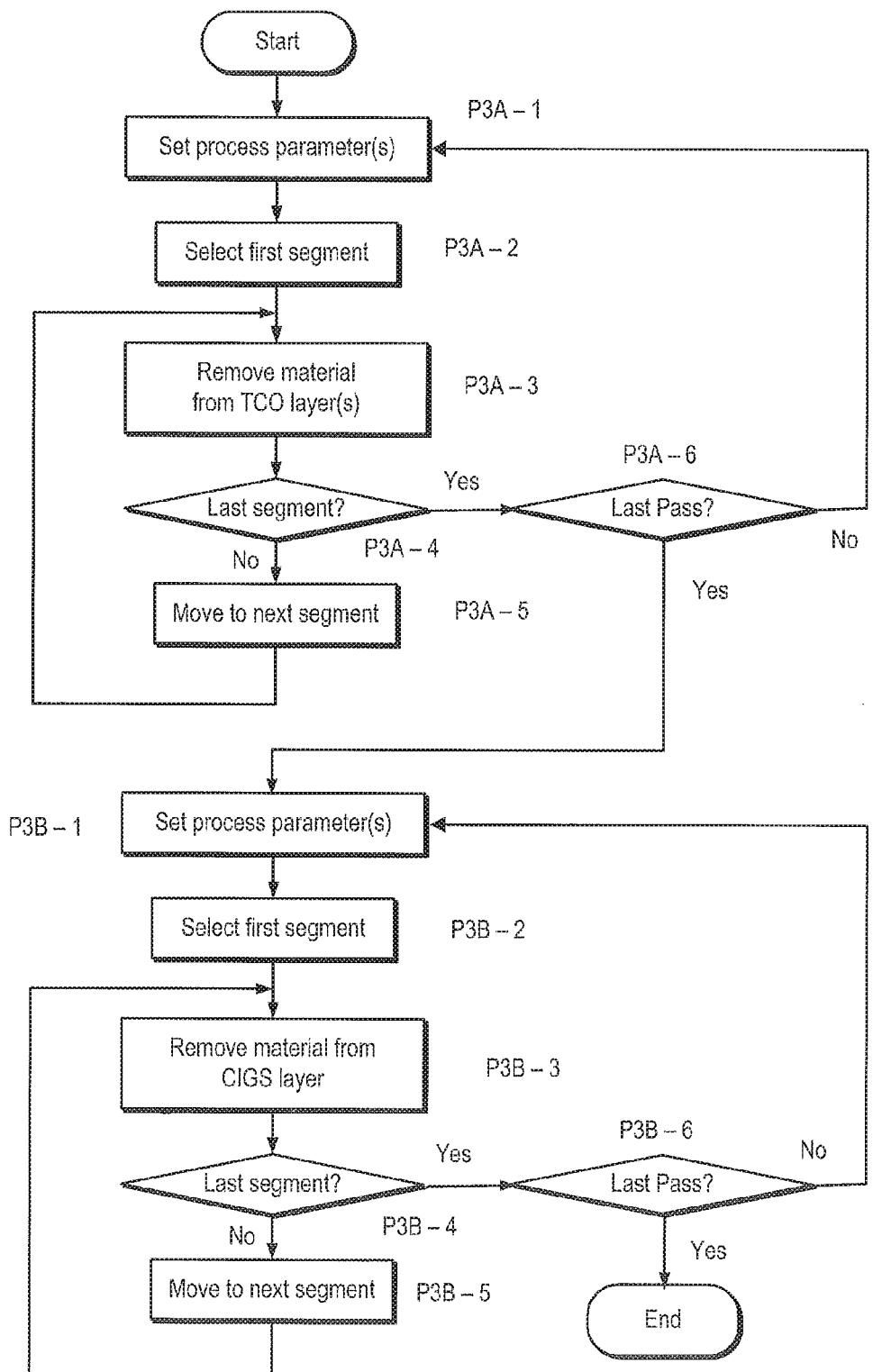
FIG. 11 is a process flow diagram of a method of scribing.

FIG. 11 is a process flow diagram of an example of one method of scribing according to the teachings of the present disclosure. Referring also to FIGS. 1, 10, the P3 scribe can be carried out by delivering a series of pulses 55 to the workpiece 2 to form a series of scribe segments $x_i$. A scribe segment $x_i$ may partially overlap adjoining scribe segments $x_{i-1}$ and $x_{i+1}$ so as to form a continuous scribe (see FIG. 13) described in more detail below. The degree of overlap can depend on scribe speed, pulse repetition frequency and the dimensions of the beam image. However, a typical linear scribing speed lies in a range of 10 mm/s to 10,000 mm/s and a typical pulse repetition frequency lies in a range of 50 KHz to 2 MHz.

The P3 scribe can be carried out in two stages, namely scribing the transparent electrode 37—the P3A scribe—and then scribing the light absorber 38—the P3B scribe.

The laser 3 is programmed so as to provide a first set of process parameters/beam characteristics (step P3A-1). Process parameters can include one or more of pulse width, pulse wavelength or wavelengths, pulse repetition rate, pulse energy, pulse fluence, pulse peak power, beam profile, including shape or size, location of image plane relative to a work surface or region of workpiece where material is to be removed. Translation speed can also be selected as well as a desired scribe segment overlap. Not all of the foregoing are independent of each other, as is understood by one of ordinary skill in the art cognizant of the present disclosure. As explained earlier, the process parameters are chosen so as to remove a region 56 of the top, transparent electrode 39 while substantially leaving intact an underlying region 57 of the light absorber 38.

The scan head 23 and/or workpiece 2 are positioned for a first scribe segment, $x_1$ (step P3A-2). The system 1 delivers a pulse 55 to the work surface which can result in removal of a part or all of section 59 of the top, transparent electrode 39 (step P3A-3). A determination is made at step P3A-4 if the last segment in a scribe channel or line has just been processed or if further segments are to be removed in the current scribe pass of the channel or line. If further segments are to be removed, the scan head 25 and/or workpiece 2 are positioned for the next segment (step P3A-6) and the process is repeated (step P3A-3). One or more of the foregoing process parameters may be changed for the performance of repeated step P3A-3. For example, repeated step P3A-3 may have a higher or lower fluence at the work surface than a prior instance (e.g., the immediately prior instance) of the execution of step P3A-3) or a different beam profile at the work surface, or be delivered at a higher or lower translation speed. Step P3B-3 can be repeated as many times as necessary, with one or more the process parameters remaining substantially the same or changed.

If it is determined at step P3A-4 that the last segment has been processed, then at step P3A-6 a determination is made as to whether to perform another pass along the scribe channel. If another pass is desired steps P3A-3, P3A-4 and P3A-5 are performed again, and can be performed as generally indicated above. However, one or more process parameters can be changed for the next pass, on a segment by segment basis, as indicated above, and the change can be made responsive to how a particular segment was earlier processed and/or responsive to an observation of scribe segment or channel or user instruction. In certain embodiments, multiple passes may be employed. Again, one or more process parameters may be changed, on pass by pass basis or just between selected segments. Processing parameters can also stay substantially the same in some instances.

Once the P3A scribe has been completed and it is determined at step P3A-5 that the last pass has been performed, the process continues by scribing the light absorber 38.

The laser 3 may be programmed so as to provide a selected set of processing parameters (step P3B-1), which may be different than those used in, for example, step P3A-1. Different beam characteristics may be obtained, for example, by varying the separation of the scan head 23 and workpiece 2 (see Δz in FIG. 8). This can change the location of the image plane relative to a work surface (such as by introducing a "ΔS" as shown in FIGS. 7a and 7b).

The scan head 23 and/or workpiece 2 are positioned for a first scribe segment, $x_1$ (step P3B-2). The system 1 delivers a pulse to the work surface which results in removal of part or all of a section 61 of the light absorber 38 (step P3B-3). If further segments 61 are to be removed (step P3B-4), the scan head 23 and/or workpiece 2 are positioned for the next segment (step P3B-5) and the process is repeated (step P3B-3). One or more of the process parameters may be changed for the performance of repeated step P3B-3. For example, repeated step P3B-3 may have a higher or lower fluence at the work surface than a prior instance (e.g., the immediately prior instance) of the execution of step P3B-3) or a different beam profile at the work surface, or be delivered at a higher or lower translation speed. Step P3B-3 can be repeated as many times as necessary, with one or more of the process parameters remaining substantially the same or changed.

If it is determined at step P3B-4 that the last segment has been processed, then at step P3B-6 a determination is made as to whether to perform another pass along the scribe channel. If another pass is desired steps P3B-3, P3B-4 and P3B-5 are performed again, and can be performed as generally indicated above. However, one or more process parameters can be changed for the next pass, on a segment by segment basis, as indicated above, and the change can be made responsive to how a particular segment was earlier processed and or responsive to an observation of scribe segment or channel or user instruction.

In certain embodiments, multiple passes may be employed. Again, one or more process parameters may be changed, on a pass by pass basis or between selected segments. Processing parameters can also stay substantially the same in some instances. As those skilled in the art will recognize, multiple passes may be employed to produce desirable complete removal of the CIGS absorber layer. The multiple scribe passes may be employed in certain embodiments to effectively laser mill a target material, such as, for example, an electrode or absorber material. The underlying material, e.g., electrode 37 (e.g., molybdenum) in the case of scribing an absorber material (e.g., CIGs) can be left substantially unaltered. A surface of the electrode material may be exposed. Once the P3B scribe has been totally completed and it is determined at step P3B-5 that the last pass has been processed, the process can end.

Figure 12A:
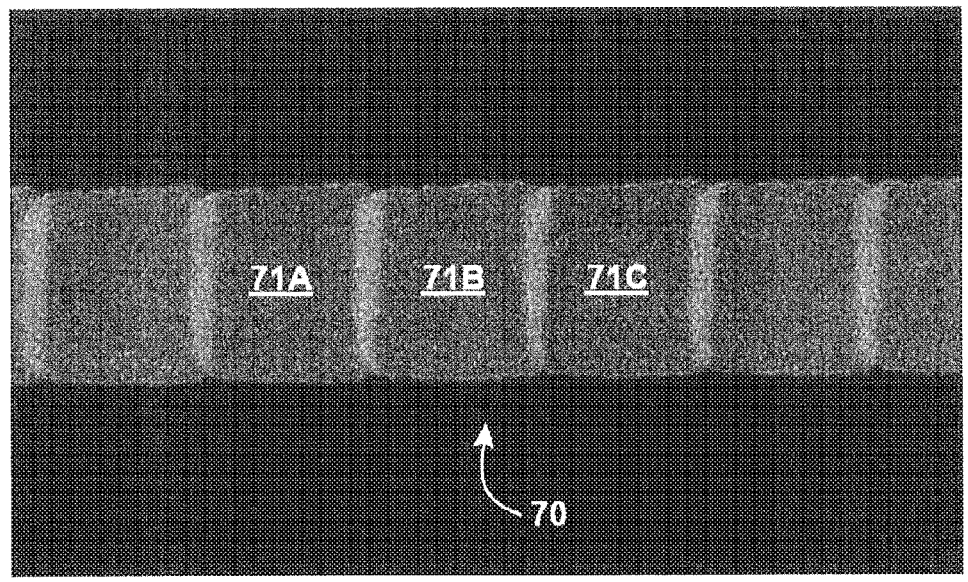
FIG. 12a is an optical micrograph of a scribe.

FIG. 12a is an optical micrograph of a scribe made with a spatially shaped beam according to the teachings herein. As is evident, FIG. 12a is a plan view of the scribe, looking down on the top surface of the photovoltaic device. It is noted that FIG. 12a is not a terraced scribe (it is more akin to, for example, a P3A scribe) and is not of a chalcopyrite semiconductor material, but is useful for discussion of the methods and apparatus taught herein. Shown is a scribe path or channel 70 comprising overlapping and rectangular scribe segments 71A, 71B and 71C. The overlapping portions of the scribes appear lighter in FIG. 12a. Note the edges of the scribe line or channel, referred to as upper edges herein, show good edge definition—the edges are generally straight and substantially free of any significant roughness.

Figure 12B:
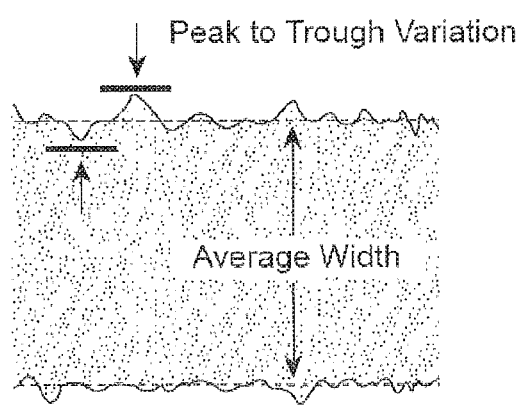
FIG. 12b illustrates a metric to evaluate the upper edge of a scribe.

FIG. 12b illustrates a metric to evaluate the upper edges of a scribe. The upper edge definition can be such that the peak to trough variation of the edge is less than a selected percentage of the average width of the scribe channel or line. For example, in the various practices of the invention as taught herein, the peak-to-trough variation can be no greater than 15%; no greater than 12%; no greater than 10%; no greater than 8%; no greater than 6%, no greater than 5; no greater than 4%; no greater than 3%, no greater than 2%; or no greater than 1% of the average width of the scribe channel.

Scribing the top, transparent electrode 37 and light absorber 38 separately can help to avoid intermixing of material and can lead to superior device performance. By precisely controlling scribing of the top, transparent electrode 39 and the light absorber 38, undesirable damage to the device can be avoided while achieving complete removal of the material overlying the bottom electrode 37. The process can help to avoid undesirable micro-cracking of the layers and re-deposition of debris which may provide shunts or otherwise reduce efficiency or device reliability, or cause mechanical dislocations, such as layer dislocation from thermal blistering. The process therefore can result in reduced numbers of scrap or low performance devices thereby resulting in increased production and decreased cost of manufacture.

Figure 13:
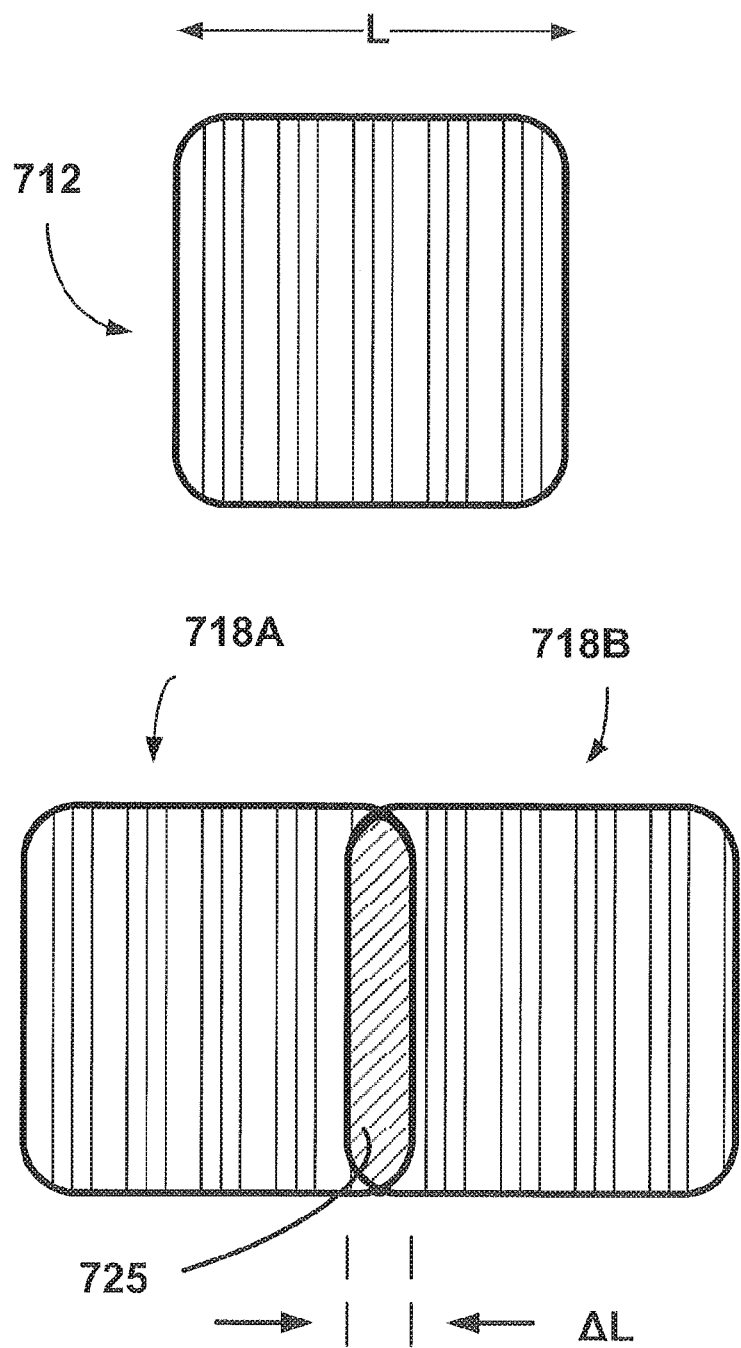
FIG. 13 schematically represents a single scribe and two overlapping scribe segments.

FIG. 13 schematically represents a single scribe and two overlapping scribe segments. More particularly, FIG. 13 schematically represents a single scribe segment 712 having sides of length L and formed with a substantially rectangular (substantially square in this instance) shaped beam. FIG. 13 also schematically illustrates two overlapping scribe segments, 718A and 718B, also formed from a laser beam having substantially square shape or profile. (In practice scribe segment 718A would also be overlapped on its left side by an adjacent scribe segment and 718B would be similarly overlapped on its right side—for simplicity these are not depicted in figure and in any event do not factor into the determination of the degree of overlap of adjacent sections) One measure of the degree of overlap of adjacent scribe sections is the ratio of the length of overlap area 725 along the scribe line to the length of the scribe segment along the scribe line. The ratio can be expressed as a percentage. For the substantially square scribe segments shown in FIG. 13, the overlap, in percent, is approximately $\Delta L/L \times 100$.

It is considered that the present teachings herein can allow for scribes having good sidewall definition, and the substantially rectangular beams and/or beams having a substantially uniform intensity distribution allow for faster processing speeds with less overlap. Overlap can be detrimental, as it can lead to local melting or heat affected zones being formed. In some practices, however, high overlap has been found to be beneficial, as it allows for better material removal. The amount of overlap required or that is beneficial can depend on the material being removed and the available pulse energies. As higher energy pulses are used, the amount of overlap may be decreased. As noted elsewhere herein, although the many of the particular examples herein pertain to photovoltaic devices that include light absorbing regions comprising chalcopyrite semiconductor materials, the apparatus and methods taught herein are applicable to other materials as well, such as, for example, photovoltaic devices comprising amorphous silicon or cadmium telluride.

In the various practices of the methods disclosed herein, the linear processing speed can be at least 10 mm/s; or at least 100 mm/s; or at least 500 mm/s; or at least 1000 mm/s; or at least 2500 mm/s; or at least 3000 mm/s; or at least 5000 mm/s; or at least 6000 mm/s; or at least 7000 mm/s, or at least 8000 mm/s; or at least 9000 mm/sec. Taken alone or in conjunction with any one of the foregoing recitations regarding linear speed, the overlap between adjacent scribes can be no greater than about 50%; or no greater than 30%; or no greater than 20%; or no greater than 10%; or no greater than 8%, 6%, 5%, 4% or 3%. In some practices, however, the overlap is no less than 50%; or no less than 60%; or no less than 75%.

Isolation Scribes

With reference to FIGS. 9-10e, the above discussion has involved removing material of top or second electrode 39 and the light absorber 38. It can also be desirable, however, to scribe the bottom or first electrode 37 as well as the light absorber 38 and top or second electrode 39. Scribes involving all three of 37, 38 and 39 are known as isolation scribes. An isolation scribe can be performed by using any of the teachings herein for scribing the top electrode 39 and light absorbing region 38 along with removal of material of the bottom or first electrode 37.

Figure 14A:
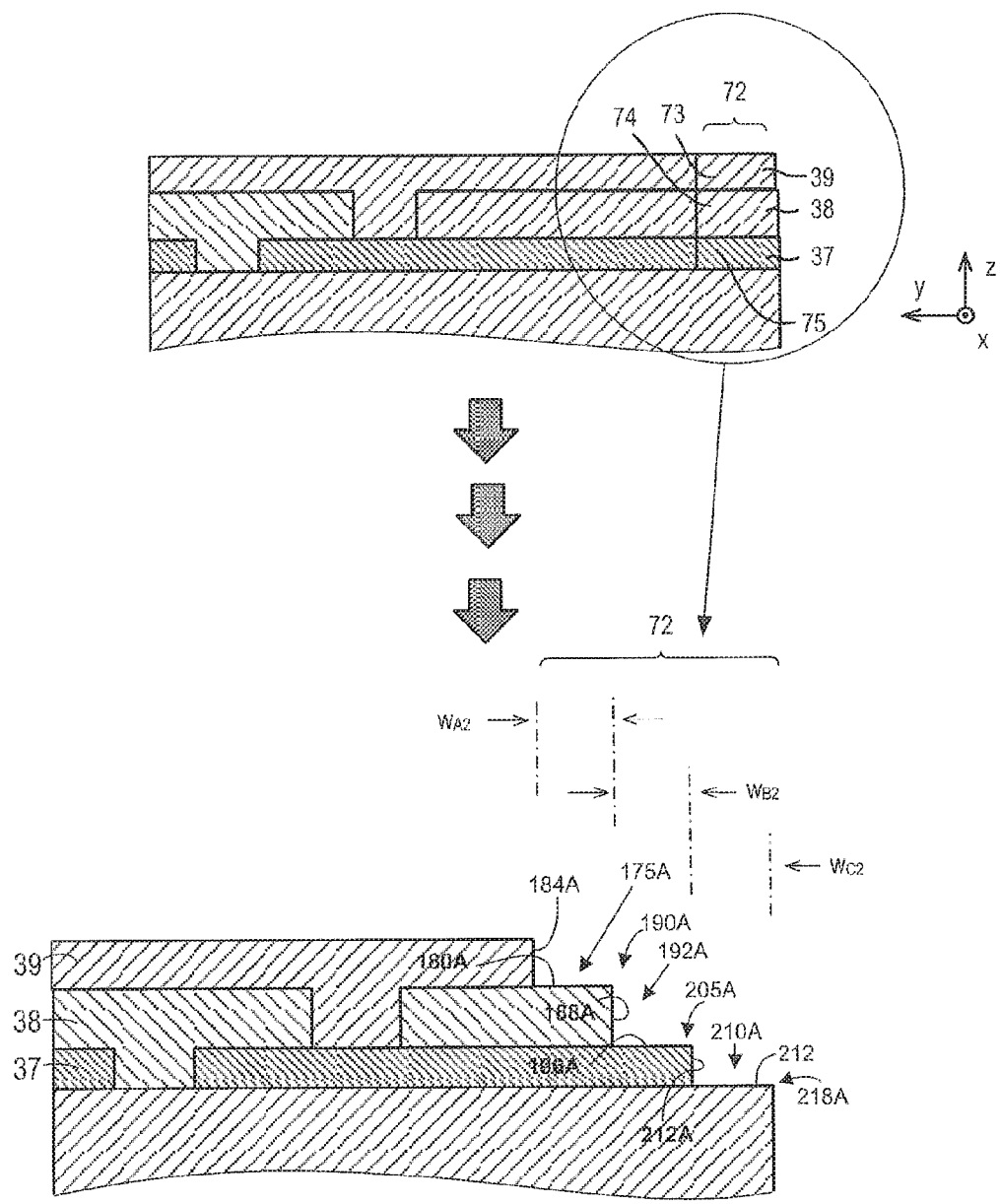
FIG. 14a schematically illustrates forming an "edge deletion" isolation scribe.

With reference to the topmost illustration of FIG. 14a, an isolation scribe can involve removal of a region 73 of the top electrode 39 along with a region 74 of the light absorber 38 and a region 75 of the bottom electrode 37. The regions 73 and 74 can be removed using, for example, the process for P3A and P3B scribes shown in FIG. 10d to create a terraced structure, followed by a scribe of the bottom electrode 37, performed so as to continue the terracing of the scribe (forming terrace 210A in bottom illustration of FIG. 14a). Certain features of the processes described elsewhere herein may be repeated in the ensuing description of isolation scribes. This is to facilitate discussion and it should not be concluded that features not repeated cannot be included. Furthermore, any new or different features or parameter ranges are by way of additional illustration, and features or parameter ranges earlier described may be used as well.

Regions 73 and 74 of respectively, the top transparent electrode 39 and light absorber 38 can be removed using the P3 process hereinbefore described to form, respectively, first terrace 175A having width $W_{A2}$ and second terrace 192A having a width $W_{B2}$.

As explained earlier, this process step may involve multiple passes of a spatially-shaped beam. The beam may have a wavelength of about 0.53 although the beam may have a wavelength of 0.5 μm. The beam output can have a profile which is substantially rectangular, such as, for example, a profile that is substantially rectangular. The profile can have a dimension transverse to the scribe direction selected to produce the desired isolation scribe first terrace width. For example, the profile dimension can be greater than or equal to $W_{A2}+W_{B2}+W_{C2}$, so as to remove a section of the top electrode extending in the y direction from the sidewall 184A to the right most edge of the photovoltaic device shown in the bottom illustration of FIG. 14a (rightmost edge of substrate under bottom electrode 37).

In various practices of the disclosure, any of $W_{A2}$, $W_{B2}$, $W_{C2}$ taken individually or the sum $(W_{A2}+W_{B2})$ or the sum $(W_{A2}+W_{B2}+W_{C2})$ may lie in the range of about 60 to 120 μm, although the range may be wider, for example, about 20 or 40 μm to about 160 μm. The beams may be spatially uniform across the beam.

An isolation scribe (referred to as edge deletion scribe when performed on the end or edge of a substrate as shown in FIG. 14a) can be performed by carrying out a P3 scribe as hereinbefore described to form a first terrace and to scribe the bottom electrode 37, as is described in more detail below.

In certain embodiments $W_{A2}$ is negligible or zero, that is, the top electrode 39 does not include the terrace 175A. Terraces 192A and 210A are present. This can result if the width in the y direction of the section 73 of the top electrode removed is the same as the y-direction width of the removed section 74 of the light absorber 38. This can occur, for example, if the technique of FIG. 10a/10b or 10e are used to remove the sections 73 and 74. In other embodiments $W_{B2}$ is negligible or zero, such the terrace 192A is not present. Terraces 175A and 210A can be present.

The fluence of the individual pulses, which may be amplitude modulated, at the work surface may have a value in a range of 0.1 or 3 J/cm². However, the fluence can have a value in a range of 0.05 to 10 J/cm².

Formation of the first terrace 175A preferably involves removing substantially all the top, transparent electrode 39 in the section 73. Formation of second terrace 192A preferably involves removing substantially all of the light absorber 38 in the first section 73 and terminating near the top of—and exposing—the bottom electrode 37.

In an alternate embodiment, in which the laser wavelength may be preferably less than 0.4 µm but greater than 0.2 µm, with a most preferred wavelength of about 0.35 µm, formation of first terrace involves removing substantially all the transparent electrode 39 and light absorber 38 and terminating near the top of—and exposing—the bottom electrode 37. In this instance $W_{A2}$ is negligible or nearly zero and the first terrace comprises the terrace 192A in FIG. 14a.

In certain embodiments, at least two passes of the laser pulse output can be used to form the terrace 192A. This can help avoid damage to the bottom electrode 37 and avoid undesirable interlayer melting between the top, transparent electrode 39 and light absorber 38.

Each pass employed to form the terrace 192A may have a shaped beam fluence value (at the work surface) above the threshold ablation value of light absorber 38. The pulsewidth may be about 30 ps, the wavelength may be about 0.53 µm, the shaped beam ablation threshold of the light absorber 38 is about 0.05 J/cm² and is slightly lower than the shaped beam threshold of the bottom electrode 37. Thus, ablation threshold contrast allows the top, transparent electrode 39 and light absorber 38 in the first area 74 to be removed while leaving the bottom electrode 37 intact.

As is also true in the case of the P3 scribing techniques described above, in the case where the top, transparent electrode 39 comprises zinc oxide doped with aluminium (ZnO:Al), the top, transparent electrode 39 only weakly absorbs light at 0.53 µm. Sharp sidewall edges 68 can be achieved for the first terrace 67 since removal of material can take advantage of mechanical rupture and ablation along a well-defined shaped beam edge.

In some embodiments, a single pass of the laser pulse output may be used to remove the top, transparent electrode 39 and light absorber 38 to form the terrace 192A.

As explained earlier, the beam can be dynamically controlled such that each output laser pulse delivered to the work surface forms a respective scribe segment $x_i$ forming part of an isolation scriber. A scribe segment $x_i$ may partially overlap adjoining scribe segments $x_{i-1}$, $x_{i+1}$. Multiple passes of the beam can be employed to laser mill material from the top, transparent electrode 39 and light absorber 38 without removing substantial material from the underlying bottom electrode 37. One or more passes are can be performed at a first fluence value or a first set of values at the work surface selected to be above—but close to—the threshold ablation of the light absorber 38. One or more laser processing passes can subsequently be performed at a second fluence value or second set of values which are different from the first value or the first set of values.

The region 75 of the bottom electrode 37 and can be removed to form the terrace 210A having a width $W_{C2}$ and thus complete the isolation scribe.

Laser processing of the bottom electrode 37 may employ one or more passes, for example two or more passes, of a spatially-shaped beam. The beam may have a wavelength of about 0.53 µm, although a beam having a wavelength of about 0.5 µm can be used.

The beam output can have a profile which is substantially rectangular, such as, for example, a beam that is substantially square. WC2 can lie in the range of about 20 µm to about 60 µm or to about 100 µm.

The fluence of the individual pulses, which may be amplitude modulated, at the work surface may have a value in a range of 0.2 to 4 J/cm². However, the fluence can have a value in a range of 0.1 to 10 J/cm².

Laser processing of the bottom electrode 37 may employ one or more passes, for example, two or more passes, of a Gaussian beam. The beam may have a wavelength of about 0.53 µm, although a beam having a wavelength of about 0.5 µm can be used. In some embodiments, a beam wavelength of about 1.06 µm or about 1.0 µm can be used. In an alternate embodiment, in which the laser wavelength may be preferably less than 0.4 µm but greater than 0.2 µm, with a most preferred wavelength of about 0.35 µm.

The fluence of the individual pulses, which may be amplitude modulated, at the work surface may have a value in a range of 0.2 to 4 J/cm². However, the fluence can have a value in a range of 0.1 to 10 J/cm² or even 20 J/cm²

Using a Gaussian beam can increase the depth of focus of the scribe and provide a smaller beam compared with a spatially-shaped beam. A greater depth of focus can help ensure that the scribe reaches the substrate 31. A smaller beam helps minimise the chance of inadvertently processing the top, transparent electrode 39 and/or light absorber 38.

The particular embodiment shown in FIG. 14a shows an isolation scribe comprising first, second and third terraces, 175A, 192A and 210A, respectively. The terrace 175A comprises the wall 180A, which is typically defined by the light absorber 38 and which can include a surface thereof exposed during scribing of the top electrode 39; the terrace 192A comprises the wall 196A, which is typically defined by the bottom electrode 37 and which can include a surface thereof exposed during scribing of the light absorber; and terrace 210A includes wall 212, which is defined by the region (e.g., supporting substrate) disposed adjacent (under) the bottom electrode 37 and typically includes a surface thereof exposed during scribing of the bottom electrode.

The isolation scribe can comprise a sidewall 184A defined by the top electrode 39, a sidewall 188A defined by the light absorber 38, and a sidewall 212A defined by the bottom electrode 196A. One end of the wall 180A can form an inside corner with the sidewall 184A and the other end can form an outside corner with the sidewall 188A. The wall 180A is typically substantially horizontal and formed by the light absorber 38, and includes a surface of the light absorber exposed during the scribe of the top electrode 39. The sidewall 188A is typically formed by light absorber 38. One end of the wall 196A, typically defined by the bottom electrode 37, forms an inside corner with the sidewall 188A and the other end forms an outside corner with the sidewall 212A. The wall 196A typically includes a surface of the bottom electrode exposed during scribing of the light absorber 38. The scribe also includes sidewall 212A, formed buy the bottom electrode, that forms the outside corner with the wall 196A at one end an inside corner with wall 212 at its other end. The scribe can include terrace shoulder 190, which comprises the outside corner formed by wall 180A and sidewall 188A, and the terrace shoulder 205A, which comprises the outside corner formed by wall 196A and sidewall 212A.

Figure 14B:
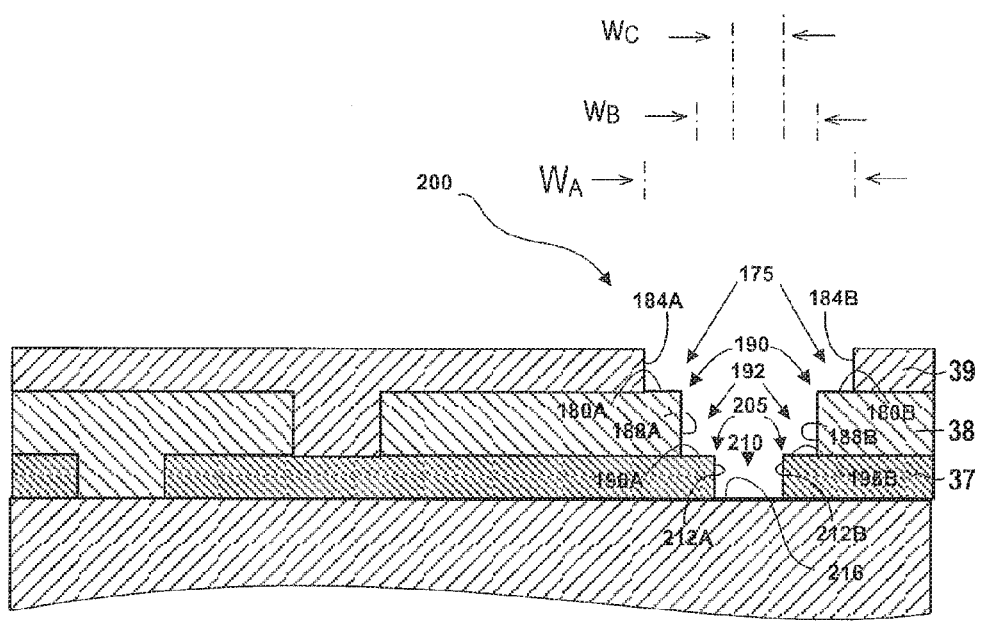
FIG. 14b depicts another example of an isolation scribe.

The walls and sidewalls shown in FIG. 14a, and those in FIGS. 10d (and 14b), can be considered to form a step configuration with risers (sidewalls) and runners (walls). FIGS. 10d and 14b show step pairs.

FIG. 14a shows an edge deletion type isolation scribe. However, an isolation scribe can also be formed away from the edge, as shown in FIG. 14b. With reference to FIG. 10d, an isolation scribe 200 (also referred to as scribe channel or line) extending into and out of the page can be considered to comprise a first scribe channel (P3A scribe) having a width $W_A$, a second scribe channel (P3B scribe) having a width $W_B$ and a third scribe channel having a width $W_C$. The third scribe channel opens into the second scribe channel, which in turn opens into the first scribe channel. The scribe line 200 comprises terraces 175, 192 and 210. The Terraces 192 can comprise typically substantially horizontal (in FIG. 10d) walls 196A and 196B, each of which typically comprises a surface of the first or bottom electrode 30, which can comprise molybdenum. The terrace 210 can comprise wall 216, which in turn can include a surface of the region underlying the bottom electrode.

FIG. 14b shares reference numerals with FIG. 10d and as to the shared reference numerals reference is made to the discussion accompanying FIG. 10d, which is equally applicable (but not repeated) here, with such modifications as will be evident to the skilled worker in light of the disclosure herein, including the present discussion of FIG. 14b.

In addition to the discussion incorporated from FIG. 10d, the scribe channel can further comprise opposing and substantially vertical sidewalls 212A and 212B, each of which typically includes a surface of the bottom electrode 37 exposed during the scribe of the bottom electrode 37. The sidewalls 212A and 212B can face each other across the scribe channel 200, and are spaced by the amount $W_C$.

In addition to the pair of terrace shoulders 192 on opposing sides of the scribe channel, the scribe 200 can include a pair of terrace shoulders 205, which can comprise opposing outside corners formed by the wall 196A and sidewall 212A and by the wall 196B and the sidewall 212B.

The wall 196A can form an inside corner at one its ends where it meets with sidewall 188A and an outside corner of the terrace shoulders 205 at the other of its ends where it meets with sidewall 212A. The wall 196B can form an inside corner at one of its ends where it meets with sidewall 188B and the other outside corner of terrace shoulders 205 at the other of its ends where it meets with sidewall 212B.

The sidewall 212A can form an inside corner where it meets one end of the wall 216 of terrace 210, and the sidewall 212B can form an inside corner where it meets the other end of the wall 216 of terrace 210.

In the embodiments hereinbefore described, a single beam is used at a time to pattern the workpiece 2. However, a plurality of beams may be used to pattern the workpiece 2 simultaneously and so increase throughput when scribing.

The beam output can have a profile which is substantially rectangular, such as, for example, a beam that is substantially square. The width $W_B$ may be less than the width $W_A$. The width $W_B$ typically can lie in the range of about 40 μm to about 100 μm. However, $W_A$ and $W_B$ may be substantially equal. The range for $W_B$ can also in some practices be wider and can, for example, be about 20 μm to about 100 μm. The width $W_C$ may typically lie in the width range of about 20-60 μm or 20 to 100 μm.

In some practices of the disclosure the width $W_B$ can lie in range of about 20 to 100 μm. The width $W_C$ can be less than $W_B$. The range may be wider, for example, about 10 μm to about 150 μm.

Figure 15:
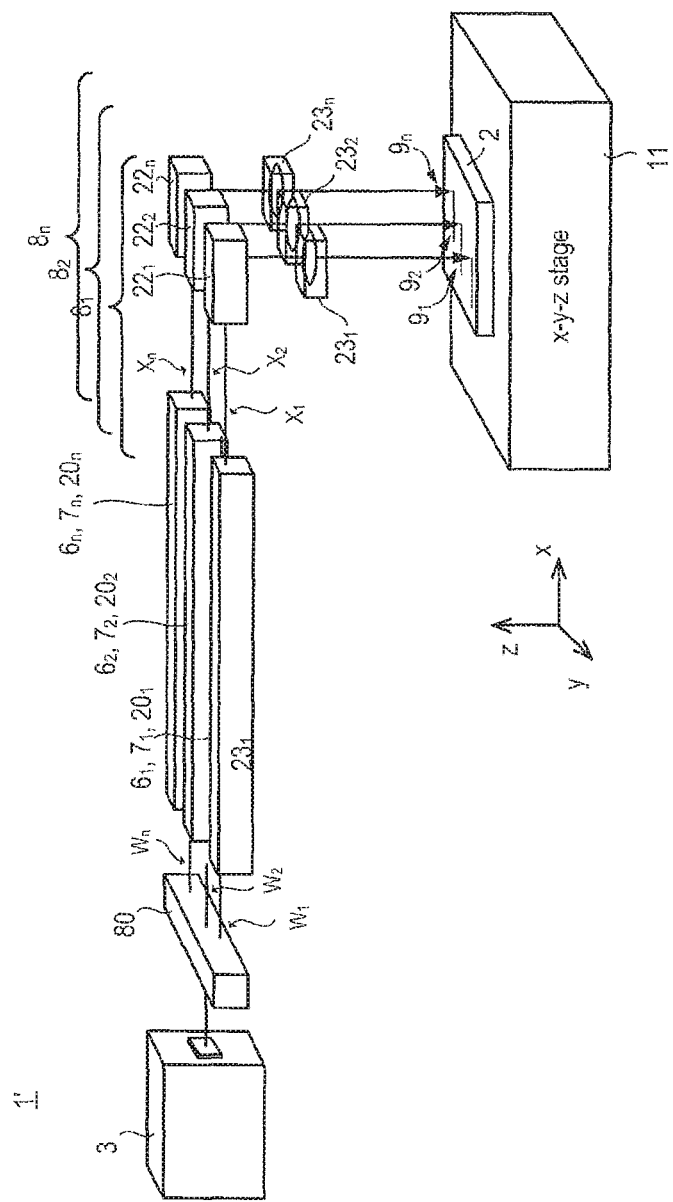
FIG. 15 is a schematic diagram of another system for patterning a layer structure using a multiple picosecond pulsed laser beam.

Referring to FIG. 15, a system 1' for patterning a workpiece 2 is shown.

In this example, the system 1' comprises an ultrafast fibre laser 3 which is the same as that described earlier. The system 1' includes a beam splitter 80 which can divide an incident beam into a plurality of beamlets $W_1, W_2, \ldots, W_n$. However, in other embodiments, a plurality of the lasers 3 can be used.

As shown in FIG. 15, each beamlet $w_1, w_2, \ldots, w_n$ can have its own beam conditioning section $6_1, 6_2, \ldots, 6_n$, beam shaping section $7_1, 7_2, \ldots, 7_n$ and imaging section $8_1, 8_2, \ldots, 8_n$, including its own routing optics $22_1, 22_2, \ldots, 22_n$ and scan head $23_1, 23_2, \ldots, 22_n$ similar to those scribed earlier. This allows the beamlets to form a respective image $9_1, 9_2, \ldots 9_n$ on the work piece 2 with the images $9_1, 9_2, \ldots, 9_n$ spatially and/or temporally separated.

In an alternate embodiment, a scan head can receive more than one beamlet. For example, entrance beamlets $x_1$ and $x_2$ can both employ scan head $23_1$ to produce respectively on the work piece 2 beamlet images $9_1$ and $9_2$. As those skilled in the art will recognize, the number for entrance beamlets $x_1$ and $x_2$ that can be usefully employed by a single scan lens is dependent on the entrance beamlet spatial size and the pupil of the scan lens, the focal length of the scan lens, and resulting field size.

The beamlet outputs can have the same or different optical characteristics, such as wavelength, pulse duration and pulse energy. The beam shaping sections $7_1, 7_2, \ldots, 7_n$ and beam imaging sections $8_1, 8_2, \ldots, 8_n$ can produce beamlet outputs having the same size and/or shape or different sizes and/or shapes.

For example, in a single-level (i.e. non terraced) process involving multiple passes, spatially-separated beamlets can deliver nominally identical pulses to the workpiece 2. This reduces the number of steps to move the workpiece 2, for example along the y-axis, to form multiple scribes thereby increasing overall system throughput of photovoltaic devices.

Alternatively, in a multi-level (i.e. terraced) process, temporally-separated beamlets can be used to form multiple terraces in the same scribe. For example, a first beamlet may have a first set of beam characteristics that may be scanned along a path over the workpiece 2. A second beamlet having a second set of beam characteristics can be scanned over the same path, but slightly later. A third beamlet having a third set of beam characteristics may scan over the same path, but later still. Thus, the first and second beamlets can form a first terrace, e.g. by removing material from the transparent electrode and the light absorber, and the third beamlet can be used to remove material from the bottom electrode.

FIG. 15 is an example of a scanning type system. As one of ordinary skill in the art will appreciate, based on foregoing discussion, the system 1' can also be implement as a non-scanning system, which can comprise objective lenses, and typically does not make use of all of the scanners $23_1, 23_2, \ldots, 22_n$.

It will be appreciated that many modifications may be made to the embodiments hereinbefore described.

Substrates may be continuous, segmented, or perforated. Substrates can be flexible or rigid. Substrates can be formed from soda-lime glass, borosilicate glass, steel, stainless steel, molybdenum, copper, aluminium, polymer, polyimide, or ceramic. A substrate formed from an insulating material may be metalized.

One of more layers of insulating material, such as silicon oxynitride ($SiO_xN_y$) may be interposed between the substrate and the bottom electrode.

The present disclosure includes particular examples directed to processing photovoltaic devices comprising materials such as chalcopyrite type semiconductors such as copper indium diselenide, copper indium gallium diselenide (materials with copper, indium, gallium and selenide are often referred to as CIGS materials) or copper indium gallium disulphide). However, techniques (i.e., methods and apparatus) taught herein are also applicable to the processing of other photovoltaics materials, such as, for example, a-Si, SiN and CdTe, SiO or other oxides or nitrides of silicon (e.g., $SiO_x$ or $SiN_x$) Such materials, such as $SiO_x$ or $SiN_x$, can be deposited on deposited on crystalline silicon, such as, for example, single crystal or polycrystalline silicon. The silicon can be untextured or textured. Photovoltaic devices comprising such other materials are often used in the superstrate configuration, and laser beams for processing can be directed through a bottom substrate and/or adjacent TCO region, for example.

Practical fluence thresholds for processing the photovoltaics materials described herein (e.g., CIGS) can be at least about 0.1 $J/cm^2$; at least about 0.2 $J/cm^2$; at least about 0.3 $J/cm^2$; at least about 0.4 $J/cm^2$, or at least about $0.5/cm^2$. Alone or in combination with any of the foregoing the fluence can be less than about 10 $J/cm^2$; less than about 5 $J/cm^2$; less than about 2.5 $J/cm^2$; less than about 2 $J/cm^2$, or less than about 1 $J/cm^2$. In certain practices, useful fluences range from about 0.1 $J/cm^2$ to about 5 $J/cm^2$ or to about 10 $J/cm^2$. Scribes can be made with a beam having a substantially rectangular shape and the foregoing fluence ranges, to produce a scribe line or channel comprised of scribe segments having a length along the scribe channel of at least 20 µm, at least 30µ, or at least 50 µm, wherein the substantially rectangular shaped pulses have a pulse repetition rate of at least 25 kHz; or of at least 50 kHz; or of at least 100 kHz; or of at least 150 kHz; or of at least 200 kHz; or of at least 250 kHz, or at least 500 kHz, and wherein the overlap of the scribe segments is no greater than about 25%, no greater than about 15%, no greater than about 10%, no greater than about 8%, no greater than about 6%, no greater than about 5%, or no greater than about 4%. The scribe segments can have substantially rectangular shape. A beam from a MOFPA as described below in conjunction with FIGS. 16a and 16b can be spatially shaped to provide the substantially rectangular beam for forming the substantially rectangular scribe segments of the scribe channel or "line." The substantially rectangular beam can have a pulse width ranging from, for example, 1 ps to 50 ps. Other useful ranges include 1 ps to 500 ps; 1 ps to 250 ps; 1 ps to 100 ps and 1 ps to 75 ps. The lower limit in the foregoing ranges can be below 1 ps, such as, for example 0.1 or 0.5 ps.

The techniques taught herein, such as, for example the use of pulsed a substantially rectangular (e.g., square) beam and/ or a beam having a substantially uniform intensity distribution can allow fast and efficient scribing of photovoltaic devices while avoiding undesirable device damage that can lead to low manufacturing yield and/or low post manufacturing device reliability.

The methods and apparatus disclosed herein can allow substantially complete removal of an overlying target region so as to satisfactorily expose, for example, a non target region (e.g., a TCO layer). Sharp scribe sidewalls are formed with no substantial interlayer mixing between dissimilar materials (e.g., between one or more of the a-Si/CdTe, back contact metallization and TCO layer for P3 scribes) that would substantially impair device performance. The sharp sidewalls and the avoidance of interlayer mixing can be maintained along a scribe line at higher processing speeds and/or with lowered scribe section overlap for numerous speed/overlap combinations, such as those noted above.

Furthermore it is found that scribes created using the spatially shaped picosecond pulsed laser beams can minimize micro-cracking and debris re-deposition which may reduce efficiency or device reliability, or cause mechanical dislocations, such as layer dislocation from thermal blistering, again at a wide variety of increase processing speeds and/or lower overlap combinations, such as is noted above.

The embodiments noted above typically involve patterning of photovoltaic structures having a "substrate" configuration, where the absorber is between the transparent conductive region and the base (e.g., absorber 33 is located between the conductive ZnO 36 and the base 31). The techniques described above can also be used for processing photovoltaic devices having the so called "superstrate" configuration. In the "superstrate" configuration the transparent conductive region is typically located between the absorber and the base substrate. The terminology is understood by those skilled in the art, though it can be confusing initially to the uninitiated because in both cases the base portion can be referred to as a substrate. The superstrate and substrate configurations differ in how they are used to generate electricity responsive to solar radiation: the solar radiation passes through the base substrate in the superstrate arrangement to reach the absorber and does not do so in the substrate configuration, but instead passes through the transparent conductive oxide on the other side of the radiation absorber from the base substrate. Patterning steps for superstrate configuration often involve the transmission of the patterning laser beams through the substrate, whereas steps are more likely to involve patterning through the transparent conductor but not the substrate when processing a photovoltaic device having the substrate configuration.

Figure 16A:
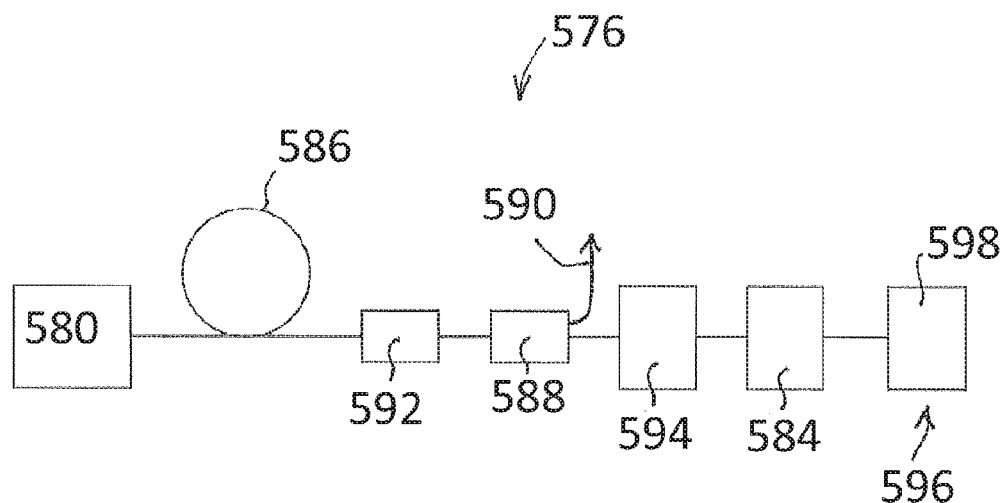
FIG. 16a is a schematic representation of an optical architecture for a fibre laser.

Referring to FIG. 16a of the drawings, there is illustrated an embodiment of an optical architecture for a fibre laser oscillator 576 that can be comprised by the fiber laser 3 of FIG. 1. The fibre laser oscillator 576 can be mode locked, and passive or active techniques can be used to achieve mode locking. The embodiment of a fibre laser oscillator shown in FIG. 9 is passively mode locked. The passively mode locked fibre laser (PMLFL) oscillator 576 includes a laser cavity comprising a semiconductor saturable absorber mirror (SESAM) 580 at one end of the cavity as the mode locking element and a second reflector 584, which can comprise, for example, a fibre Bragg grating (FBG), at the other end of the cavity. The laser cavity can also include a length of active optical fibre 586, such as, for example, a length of rare earth doped (RED) optical fibre, and a coupler 588 for providing the output 590 from the fibre laser oscillator 576. The length of active optical fibre 586 can comprise a short length (e.g., tens of cm's) of single mode (SM) ytterbium-doped fibre, having, for example, a core diameter of 4-5 µm, a cladding diameter of 125 µm, and a concentration of Yb disposed in the core of the fibre for providing, for example, an absorption of about 300 dB/m in the 980 nm band. The pump source 596 can comprise a single emitter laser diode 598 operating in the 980 nm absorption band of ytterbium and providing an output power in the range of hundreds of mW, and can pump the laser cavity through the fibre Bragg grating (FBG) reflector 584, which can be transmissive at the pump wavelength. The fibre laser oscillator 576 can output, for example, a pulse width of a few to tens of ps, a center wavelength of 1064 nm, and operate at PRF of 20 MHz. The pulses can have an energy in the pJ range, and the average power of the fibre laser oscillator 576 can be in the range of a few mW to a few tens of mW.

Note that in an alternative embodiment of the fibre laser oscillator 576, the grating 584 can be partially transmissive at the operating wavelength of the PMLFL such the cavity output is through the grating 584. In this instance the pump optical energy need not be provided to the laser cavity through the grating 584 as shown in FIG. 9, but instead reference numeral 588 can represent a wavelength division multiplex (WDM) coupler for coupling the pump optical energy to the laser cavity (and passing 1064 nm), where reference numeral 590 would represent a WDM input arm to which the laser diode 598 is optically coupled.

Figure 16B:
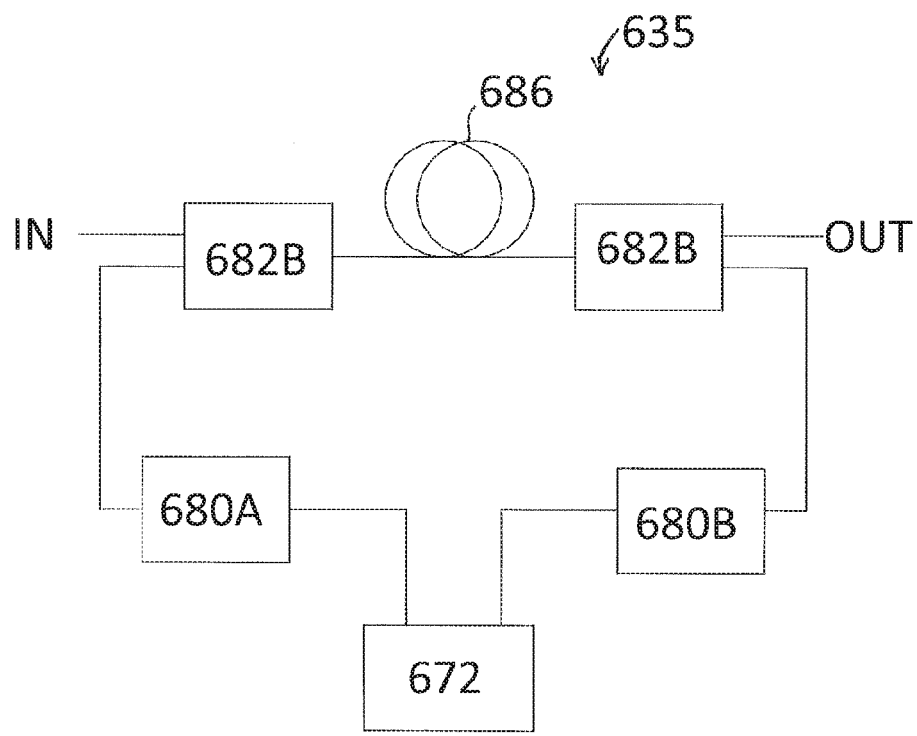

Referring to FIG. 16b of the drawings, there is illustrated an embodiment of the architecture of an optical fibre amplifier 635 that can be located downstream of the fibre laser oscillator 576 as part of the UFMOPA 110. The arrangement of a laser oscillator with an optically downstream amplifier to provide a higher power output from the amplifier than would typically be available from the oscillator alone is known in the art as a master oscillator—power amplifier or MOPA. The amplifier 635 is fibre based and can include a pair of pump sources 680A and 680B, which can each comprise a fibre pigtailed laser diode that provides pumping optical energy via optical couplers 682A and 682B, respectively, to the length of RED optical fibre 686. A controller (not shown) can control gain of the amplifier 635 via control of the optical power emitted by the pump sources 680A and 680B, such as by controlling the current supplied to the laser diodes comprised by the pump sources 680A and 680B.

The pump sources 680A and 680B can each comprise a 200 mW 980 nm laser diode. The optical couplers 682A and 682B, which can each comprise a WDM optical fibre coupler that couples the 980 nm optical pumping energy to the core of the length of RED fibre 686 while providing low insertion loss to the optical energy being amplified by the length of RED fibre 686. The length of RED fibre 686 can include a Yb-doped core having a diameter of approximately 6 μm and a cladding having a diameter of approximately 125 μm. The core can have a numerical aperture (NA) of approximately 0.14. The core can include a concentration of Yb sufficient, for example, for providing greater than 100 dB/m at 915 nm. One suitable fibre is the YB 500 fibre available from specialty optical fibre manufacturer CorActive High-Tec Inc., having coordinates of 2700 Jean-Perrin, Suite 121, Quebec City, QC, Canada G2C 1S9.

The optical fibre amplifier 635 can be operated linearly or non-linearly. Typically the optical amplifier is operated non-linearly. In this non-linear regime, the length of RED fibre 686 can modify (e.g., increase) the bandwidth of signal it amplifies via a non-linear effect, such as, for example, self phase modulation (SPM). The spectral broadening due to the SPM contributes to the output spectral bandwidth. If it is desired that the fibre amplifier operate linearly, it is typical to increase the core diameter of the length of RED 686 optical fibre to decrease the power density. For example, the core diameter can be greater than 10 μm, such as, for example, 15 μm. The core can also have a reduced NA, such as, for example, a NA of 0.09, and the length of RED optical fibre 686 can comprise what is known in the art as a Large Mode Area, or "LMA", optical fibre.

The term Master Oscillator Fibre Power Amplifier (MOFPA), as used herein, refers to a master oscillator power amplifier arrangement where at least one of the master oscillator and the power amplifier comprises an active optical fibre, such as a RED optical fibre, as an active element. Typically both the master oscillator and the power amplifier include active optical fibres. However, this need not be the case. For example, the master oscillator could comprise a microchip or diode laser that seeds an optical fibre amplifier, such as, for example, the optical fibre amplifier 635.

The pulse repetition rate of the output from a MOFPA (typically in the MHz range) can be reduced via a "pulse picker", which can comprise an Acousto Optic Modulator (AOM), located optically downstream of one or both the master oscillator and the power amplifier. Such "pulse picking" can reduce the pulse repetition rate to the kHz range that is often used in the processing of materials. "Pulse picking" is known in the art, and is not further described herein. Also, as the skilled worker can ascertain from the teachings herein, more than one amplifier stage can be used optically downstream of a master oscillator, and the number of stages, and the gain each provides, can be adjusted to provide a particular power output from the MOFPA in terms of pulse energy, peak power, average power, etc.

Although FIGS. 16a and 16b show optically pumping a laser oscillator or an optical fiber amplifier using discrete couplers or, in the case of an oscillator, end pumping through a fiber Bragg grating, other techniques can be used. For example, it is also possible to pump a length of rare earth doped fiber of an oscillator or amplifier via an arrangement wherein a pump fiber runs adjacent to and coextensive with the rare earth doped fiber within a common jacket or coating. A fiber that includes both the rare earth doped fiber and the pump fiber can be drawn as a single continues fiber structure from a draw tower.

The present disclosure is directed to each individual feature, system, material and/or method described herein. In addition, any combination of two or more such features, systems, materials and/or methods, if such features, systems, materials and/or methods are not mutually inconsistent, is included within the scope of the present invention.

However, those skilled in the art would readily appreciate that all parameters, dimensions, materials and configurations described herein are meant to be exemplary and that in certain practices of the invention actual parameters, dimensions, materials and configurations can depend on specific applications for which the teaching of the present disclosure is used. Accordingly, one of ordinary skill understands that the invention may be practiced otherwise than as specifically described and remain within the scope of the appended claims and equivalents thereto.

The present disclosure is directed to each individual feature, system, material and/or method described herein. In addition, any combination of two or more such features, systems, materials and/or methods, if such features, systems, materials and/or methods are not mutually inconsistent, is included within the scope of the present invention. However, those skilled in the art would readily appreciate that all parameters, dimensions, materials and configurations described herein are meant to be exemplary and that in certain practices of the invention actual parameters, dimensions, materials and configurations can depend on specific applications for which the teaching of the present disclosure is used. Accordingly, one of ordinary skill understands that the invention may be practiced otherwise than as specifically described and remain within the scope of the appended claims and equivalents thereto.

In the claims as well as in the specification above all transitional phrases such as "comprising," "including," "carrying," "having," "containing," "involving" and the like are understood to be open-ended. Only the transitional phrases "consisting of" and "consisting essentially of" shall be closed or semi-closed transitional phrases, respectively, as set forth in the U.S. Patent Office Manual of Patent Examining Procedure §2111.03.

The phrase "A or B" as in "one of A or B" is generally meant to express the inclusive "or" function, meaning that all three of the possibilities of A, B or both A and B are included, unless the context clearly indicates that the exclusive "or" is appropriate (i.e., A and B are mutually exclusive and cannot be present at the same time). "At least one of A, B or C" (as well as "at least one of A, B and C") reads on any combination of one or more of A, B and C, including, for example the following: A; B; C; A & B; A & C; B & C; A & B; as well as on A, B & C.

It is generally well accepted in patent law that "a" means "at least one" or "one or more." Nevertheless, there are occasionally holdings to the contrary. For clarity, as used herein "a" and the like mean "at least one" or "one or more." The phrase "at least one" may at times be explicitly used to emphasize this point. Use of the phrase "at least one" in one claim recitation is not to be taken to mean that the absence of such a term in another recitation (e.g., simply using "a") is somehow more limiting. Furthermore, later reference to the term "at least one" as in "said at least one" should not be taken to introduce additional limitations absent express recitation of such limitations. For example, recitation that an apparatus includes "at least one widget" and subsequent recitation that "said at least one widget is coloured red" does not mean that the claim requires all widgets of an apparatus that has more than one widget to be red. The claim shall read on an apparatus having one or more widgets provided simply that at least one of the widgets is coloured red. Similarly, the recitation that "each of a plurality" of widgets is coloured red shall also not mean that all widgets of an apparatus that has more than two red widgets must be red; plurality means two or more and the limitation reads on two or more widgets being red, regardless of whether a third is included that is not red, absent more limiting explicit language (e.g., a recitation to the effect that each and every widget of a plurality of widgets is red).

The invention claimed is:

1. A scribed photovoltaic device, comprising:
   a photovoltaic device configured for generating electrical energy responsive to receiving solar radiation, the photovoltaic device comprising a plurality of electrically connected photovoltaic sections comprising a photovoltaic light absorbing chalcopyrite semiconductor region ("PLACS region") disposed between first and second electrode regions;
   the photovoltaic sections comprising a scribe channel extending along and into two of the regions;
   the scribe channel comprising a pair of spaced opposing sidewalls of one of the regions, a pair of terraces comprising a pair of spaced opposing terrace shoulders, and a second pair of spaced opposing sidewalls of another one of the regions, the spacing of the second pair of sidewalls being different than the spacing of the first pair of sidewalls;
   wherein the spacing of the second pair of sidewalls is less than the spacing of the first pair of sidewalls; and
   wherein said another one of the regions comprises the PLACS region.

2. The scribed photovoltaic device of claim 1 wherein the pair of terraces of the scribe channel comprises a surface of said another one of the regions.

3. The scribed photovoltaic device of claim 1 wherein the one of the regions comprises one of the electrode regions, said one of the electrode regions being optically transparent.

4. The scribed photovoltaic device of claim 3 wherein said one of the electrode regions comprises doped zinc oxide.

5. The scribed photovoltaic device of claim 1 wherein said scribe channel is at least partially filled with an electrically insulating material.

6. The scribed photovoltaic device of claim 1 wherein said scribe channel comprises a laser formed scribe channel.

7. The scribed photovoltaic device of claim of claim 4 wherein said doped zinc oxide is doped with aluminum.

8. The scribed photovoltaic device of claim 4 wherein said scribe channel comprises a laser formed scribe channel.

9. The scribed photovoltaic device of claim 3 comprising a buffer interposed between the PLACS region and said one of the electrode regions, the buffer including a layer of cadmium sulphide (CdS).

10. The scribed photovoltaic device of claim 1 wherein said PLACS region comprises copper indium diselenide (CuInSe2).

11. The scribed photovoltaic device of claim 1 wherein said PLACS region comprises copper indium gallium diselenide (CuInGaSe2).

12. The scribed photovoltaic device of claim 1 wherein said PLACS region comprises copper indium gallium disulphide (CuInGaS2).

13. The scribed photovoltaic device of claim 1 wherein one of said first and second electrode regions comprises molybdenum.

14. The scribed photovoltaic device of claim 1 wherein said scribed photovoltaic device comprises a substrate, said substrate comprising a polymer.

15. The scribed photovoltaic device of claim 1 wherein said scribed photovoltaic device comprises a substrate, said substrate comprising a metal.

16. The scribed photovoltaic device of claim 1 wherein said scribed photovoltaic device comprises a substrate, said substrate comprising a glass.

* * * * *